(12) United States Patent
Kim et al.

(10) Patent No.: US 6,850,006 B2
(45) Date of Patent: Feb. 1, 2005

(54) ORGANIC ELECTROLUMINESCENT DEVICE AND METHOD OF MANUFACTURING THE SAME

(75) Inventors: Seon Hee Kim, Busan Metropolitan (KR); Kyung Han Kim, Kyungju (KR); Tae Seung Kim, Busan Metropolitan (KR)

(73) Assignee: Samsung NEC Mobile Display Co., LTD, Ulsan Metropolitan (KR)

( * ) Notice: Subject to any disclaimer, the term of this patent is extended or adjusted under 35 U.S.C. 154(b) by 65 days.

(21) Appl. No.: 10/152,339

(22) Filed: May 22, 2002

(65) Prior Publication Data

US 2003/0080678 A1 May 1, 2003

(30) Foreign Application Priority Data

Oct. 26, 2001 (KR) ........................................ 2001-66441

(51) Int. Cl.$^7$ ................................................. H01J 1/70
(52) U.S. Cl. ....................... 313/512; 313/506; 313/498; 313/504
(58) Field of Search ................................ 313/512, 498, 313/504, 506

(56) References Cited

U.S. PATENT DOCUMENTS

| | | | | |
|---|---|---|---|---|
| 4,829,213 A | * | 5/1989 | Pecile et al. ................ | 313/509 |
| 5,814,935 A | | 9/1998 | Ujihara | |
| 5,883,465 A | * | 3/1999 | Inoguchi et al. ............ | 313/509 |
| 6,140,765 A | * | 10/2000 | Kim et al. ................... | 313/506 |
| 2002/0086180 A1 | * | 7/2002 | Seo et al. .................... | 313/506 |

FOREIGN PATENT DOCUMENTS

| | | |
|---|---|---|
| EP | 0 609 074 | 8/1994 |
| EP | 0996314 | 4/2000 |
| EP | 1 109 224 | 6/2001 |
| EP | 1 253 653 | 10/2002 |
| JP | 9-274990 | 10/1997 |
| JP | 11-354272 | 12/1999 |
| JP | 2000-30858 | 1/2000 |
| JP | 2000-243555 | 9/2000 |
| JP | 2001291580 | 10/2001 |
| JP | 200.1189191 | 7/2002 |
| KR | 2000-0010172 | 2/2000 |
| WO | 00/69002 | 11/2000 |
| WO | 02/21557 | 3/2002 |

* cited by examiner

*Primary Examiner*—Nimeshkumar D. Patel
*Assistant Examiner*—Sharlene Leurig
(74) *Attorney, Agent, or Firm*—Staas & Halsey LLP

(57) ABSTRACT

An organic electroluminescent device and a method of manufacturing the same are provided. The organic electroluminescent device includes: a transparent substrate; a first electrode layer including a series of first electrode lines formed on the top surface of the substrate as a predetermined pattern and connected to first electrode pad portions at opposite edges of the substrate; an organic layer formed as a predetermined pattern on the first electrode lines; a second electrode layer including a series of second electrode lines formed on the substrate, on which the first electrode lines and the organic layer are formed, as a predetermined pattern to be insulated from the first electrode lines and connected to second electrode pad portions at the other edges of the substrate; a cap bonded to the substrate using a sealant to seal the organic layer within its inner sealing space; and a barrier portion which blocks the flow of the sealant on the substrate inwards or outwards the sealing space.

13 Claims, 15 Drawing Sheets

ORGANIC ELECTROLUMINESCENT DEVICE AND METHOD OF MANUFACTURING THE SAME

CROSS-REFERENCE TO RELATED APPLICATIONS

This application claims the benefit of Korean Application No. 01-66441, filed Oct. 26, 2001, in the Korean Industrial Property Office, the disclosure of which is incorporated herein by reference.

BACKGROUND OF THE INVENTION

1. Field of the Invention

The present invention relates to organic electroluminescent devices, and more particularly, to an organic electroluminescent device with an improved sealing structure and a method of manufacturing the organic electroluminescent device.

2. Description of the Related Art

Recently, electroluminescent (EL) devices regarded as self-luminous type display devices are receiving a lot of attention as a next-generation display device due to advantages of a wide viewing angle and good contrast and rapid response characteristics. EL devices are classified into inorganic EL devices and organic EL devices depending on the material of the emissive layer. Organic EL devices can realize color display and have better luminance and response characteristics than inorganic EL devices.

In the manufacture of an organic electroluminescent device, anodes are formed on a glass substrate or another type of transparent insulating substrate in a predetermined pattern, and an organic layer and cathodes are sequentially deposited on the anodes such that the cathodes intersect the anodes. The organic layer includes a hole transporting layer as the lowermost layer, an emissive layer, and an electron transporting layer, which are sequentially stacked using organic compounds. Suitable organic compounds for these organic layers include copper phthalocyanine (CuPc), N,N'-di(naphthalene-1-yl)-N,N'-diphenyl-benxidine (NPB), tris-8-hydroxyquinoline aluminum (Alq3) and the like.

As a voltage is applied across the anode and cathode of an organic EL device having the structure described above, holes injected from the anode are transported across the hole transporting layer to the emissive layer. Electrons injected from the cathode are transported across the electron transporting layer to the emissive layer. Excitons are generated in the emissive layer by recombination of electrons and holes. As the excitons transit from an excited state to a ground state, fluorescent molecules of the emissive layer emit light, and thus an image can be displayed.

Organic materials used in such an organic EL device described above are adversely affected by moisture and oxygen in the air. Moisture and oxygen degrade the characteristics of the organic material, cause delaminating of the cathode, and reduce the lifetime of the organic EL device. For these reasons, the organic EL device is encapsulated to protect the organic layer from moisture and impurities present in the air, as illustrated in FIGS. 1 through 4.

In particular, as illustrated in FIGS. 1 and 2, the rear surface of a transparent substrate 22 on which an organic layer 21 has been formed is sealed with a metal cap 23 or a glass cap 24 using a sealant 25. In an alternative method, multiple layers of sealant are coated on the rear surface of the transparent substrate 22 to form an encapsulation layer 26 for the organic layer 21 formed on the rear surface, as illustrated in FIG. 3. In another alternative method, as illustrated in FIG. 4, at least one sealing layer 27 is formed to cover the organic layer 21 formed on the rear surface of the transparent substrate 22, and covered once again with a cap 28 attached to the transparent substrate 22.

As examples of the sealing structures described above, U.S. Pat. No. 5,059,862, U.S. Pat. No. 5,047,687, and U.S. Pat. No. 5,059,861 disclose sealing structures with a capping layer on the organic layer. Japanese Laid-open Patent Publication No. hei 9-274990 discloses a sealing structure in which the organic layer is sealed with a polyurethane sealing layer and the sealing layer is encapsulated with an external sealing layer containing a moisture absorbent. U.S. Pat. No. 5,882,761 discloses a sealing structure in which a glass sealing case is mounted on the rear surface of a transparent substrate to seal the organic layer formed thereon, a moisture absorbent is placed inside the glass sealing case, and the space formed between the glass sealing case and the transparent substrate is filled with inert gas.

In the above-described sealing structures for organic EL devices, the sealant used to attach a metal cap or glass cap to the transparent substrate may contaminate the organic layer. In particular, to seal the organic layer with the metal cap or glass cap, the sealant is initially applied on a bonding site and pressed with the metal cap or glass cap to cover the organic layer. During this sealing process, the sealant is squeezed and spreads out toward the inside and the outside of the sealed space of the organic EL device. When the sealant spread out into the sealing space reaches the active area of the organic layer, the organic layer is deteriorated by the solvent of the sealant. When electrode pads to apply a voltage to the organic layer are interposed at the bonding site of the transparent substrate with the metal cap or glass cap, the solvent of the sealant easily permeates the organic layer along the electrode pads and contaminates or corrodes the external protruding ends of the electrode pads. This contamination or corrosion of the external protruding electrode ends increases adhesion of the electrode pads to the edge of the ground substrate and thus relatively decreases adhesion to a flexible printed circuit board, which should be connected to the electrode pads to apply a voltage.

In the manufacture of organic EL devices, a number of organic EL devices are simultaneously manufactured in a single large substrate and then separated into individual devices by cutting. Therefore, the spread of the sealant over the cutting sites may cause failures in the cutting process. This undesired spread of the sealant significantly degrades the quality of the organic EL device in terms of lifetime, color purity, and luminance.

To address this problem, Korean Laid-open Patent Publication No. 2000-10172 discloses an example of an organic EL device. This suggested organic EL device has a barrier inside the sealant layer to prevent the sealant from spreading over an emissive portion 30, as illustrated in FIG. 5. In particular, the organic EL device includes a lower substrate 31 having the emissive portion 30 on its top surface, an upper substrate 32 disposed above the lower substrate 31 with a predetermined gap, an internal barrier 33 formed along the edges of the upper substrate 32 and the lower substrate 31 to seal the space therebetween, and a sealant layer 34 attached to the outside wall of the internal barrier 33 to combine the upper substrate 32 and the lower substrate 31.

In the organic EL device illustrated in FIG. 5, the internal barrier 33 should be formed to a height no less than 0.5 mm so that the internal space is high enough to protect the emission layer 30 from external impacts and large enough to accommodate a moisture absorbent therein. It is difficult to form such a tall internal barrier using a photoresist method or silk-screen printing technique. To form such a tall internal barrier described above, repeated depositions are required, which degrades the shape or intensity of the resulting internal barrier.

When a flexible printed circuit board is connected to the lower substrate 31, spreading of the sealant out of the sealing structure cannot be effectively suppressed, thereby causing failures in a subsequent substrate cutting process. In addition, the sealing structure described above does not ensure an external margin large enough to bind the flexible printed circuit board and the electrode pads together. In connecting the flexible printed circuit board to the electrode pads of the organic EL device, the electrode pad area is not fully covered by the flexible printed circuit board so that the ends of the electrode pads are exposed in the air. Therefore, there is a problem in that the exposed ends of the electrode pads act as passages along which moisture or foreign materials enter the organic layer.

SUMMARY OF THE INVENTION

According, it is an object of the present invention to provide an organic electroluminescent (EL) device with a simple structure capable of preventing contamination of the organic layer by a sealant and capable of improving failures in bonding an electrode pad area of the substrate and a flexible printed circuit board.

It is another object of the present invention to provide an organic EL device capable of preventing corrosion of a portion of an electrode pad area which is uncovered with a flexible printed circuit board connected to the substrate.

It is yet another object of the present invention to provide a method of fabricating an organic EL device.

Additional objects and advantages of the invention will be set forth in part in the description which follows and, in part, will be obvious from the description, or may be learned by practice of the invention.

The foregoing and other objects of the present invention are achieved by providing an organic EL device comprising: a substrate which is transparent; a first electrode layer including a series of first electrode lines formed on the top surface of the substrate as a predetermined pattern and connected to first electrode pad portions at two opposite edges of the substrate; an organic layer formed as a predetermined pattern on the first electrode lines; a second electrode layer including a series of second electrode lines formed on the substrate, on which the first electrode lines and the organic layer are formed, as a predetermined pattern to be insulated from the first electrode lines and connected to second electrode pad portions at the other two edges of the substrate; a cap bonded to the substrate using a sealant to seal the organic layer within its inner sealing space; and a barrier portion which blocks the flow of the sealant on the substrate inwards or outwards of the sealing space.

An embodiment of the present invention provides that the barrier portion has a height greater than the first and second electrode pad portions located at the edges of the substrate. Further, the barrier portion is formed as a closed loop along a bonding site of the substrate on which the sealant is applied. Still further, the organic EL device according to the present invention further comprises a sealing layer which covers the organic emission layer.

The foregoing and other objects of the present invention may also be achieved by providing an organic EL device comprising: a substrate which is transparent; an organic emission portion including a first electrode layer having a series of first electrode lines formed on the top surface of the substrate as a predetermined pattern and connected to first electrode pad portions at two opposite edges of the substrate, an organic layer formed as a predetermined pattern on the first electrode lines, a second electrode layer having a series of second electrode lines formed on the substrate, on which the first electrode lines and the organic layer are formed, as a predetermined pattern to be insulated from the first electrode lines and connected to second electrode pad portions at two other edges of the substrate; a sealing layer which covers only the organic emission portion but uncovers the first and second electrode pad portions located at the edges of the substrate; a flexible printed circuit board which supplies a predetermined current to the series of first and second electrode lines in connection with the first and second electrode pad portions located at the edges of the substrate; and a barrier portion which covers a portion of the first and second electrode pad portions exposed when bonded to the flexible printed circuit board.

The foregoing and other objects of the present invention may also achieved by providing a method of manufacturing an organic EL device, the method comprising: preparing a substrate which is transparent and has a transparent conductive layer and a metal conductive layer which are sequentially stacked on the top surface of said substrate; forming first and second electrode pad portions at the edges of the substrate by processing the metal conductive layer; forming a series of first electrode lines as a predetermined pattern to be connected with the respective first electrode pad portions by processing a portion of the transparent conductive layer exposed by the first and second electrode pad portions; forming an internal insulator layer as a grid pattern on the substrate to divide the first electrode lines located at an active area; forming a barrier portion on the substrate along the boundary of the active area to block a sealant from spreading out inwards or outwards of the active area of the substrate when the substrate is bonded to a cap using the sealant; forming an organic layer and a series of second electrode lines connected to the respective second electrode pad portions on the substrate; and sealing the active area by bonding the substrate to the cap.

The foregoing and other objects of the present invention may also be achieved by providing a method of manufacturing an organic EL device, the method comprising: preparing a substrate which is transparent; forming an organic emission portion on the substrate, the organic emission portion including an organic layer and first and second electrode lines connected, respectively, to first and second electrode pad portions, the organic layer being interposed between the first and second electrode lines; forming a barrier portion on the substrate along the boundary of the organic emission portion to block a sealant from spreading out inwards or outwards of the organic emission portion when the substrate is bonded to a cap using the sealant; and sealing the organic emission portion by bonding the substrate to the cap.

BRIEF DESCRIPTION OF THE DRAWINGS

These and other objects and advantages of the invention will become apparent and more readily appreciated from the following description of the embodiments, taken in conjunction with the accompanying drawings of which.

DETAILED DESCRIPTION OF THE INVENTION

Figure 1:
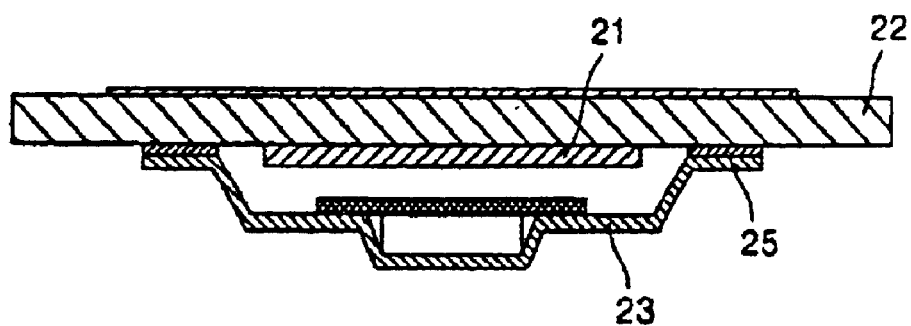
FIGS. 1 through 4 are sectional views of conventional sealing structures of organic electroluminescent (EL) devices.
Figure 2:
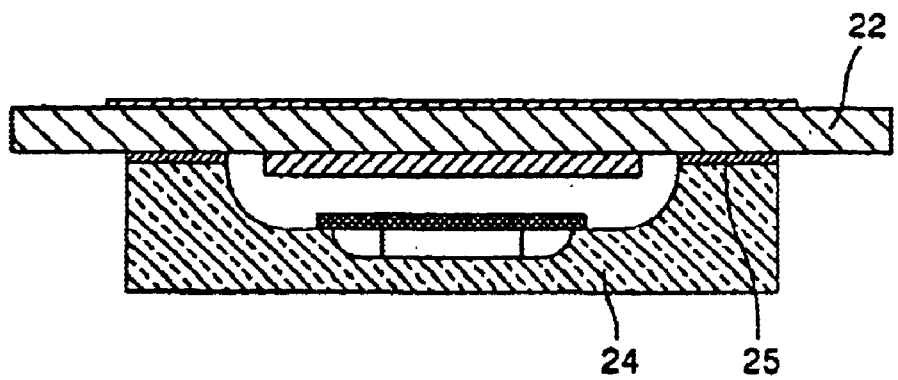
Figure 3:
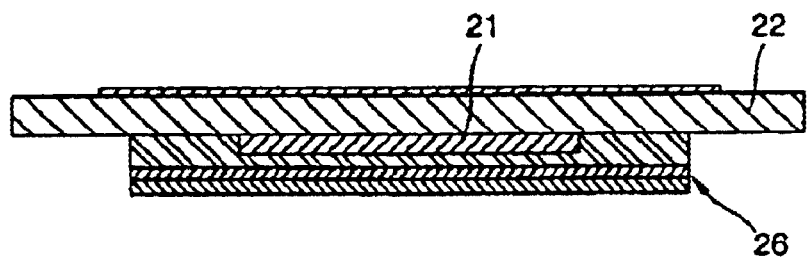
Figure 4:
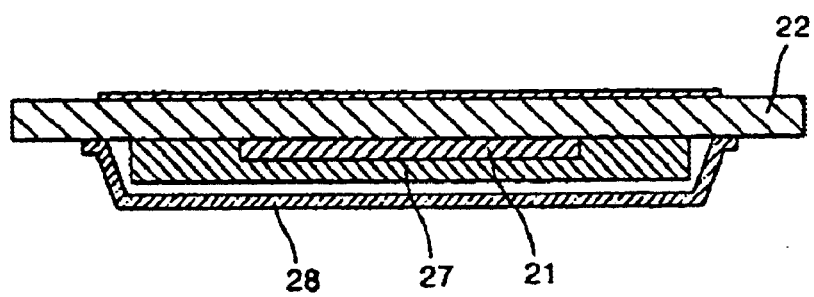
Figure 5:
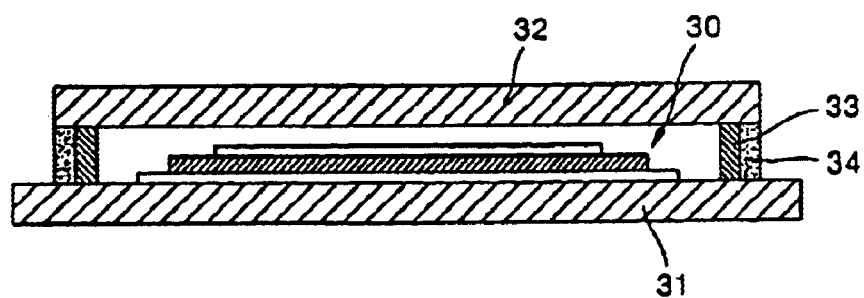
FIG. 5 is a sectional view of another conventional organic EL device.

Reference will now be made in detail to the embodiments of the present invention, examples of which are illustrated in the accompanying drawings, wherein like reference numerals refer to like elements throughout. The embodiments are described below in order to explain the present invention by referring to the figures.

Figure 6:
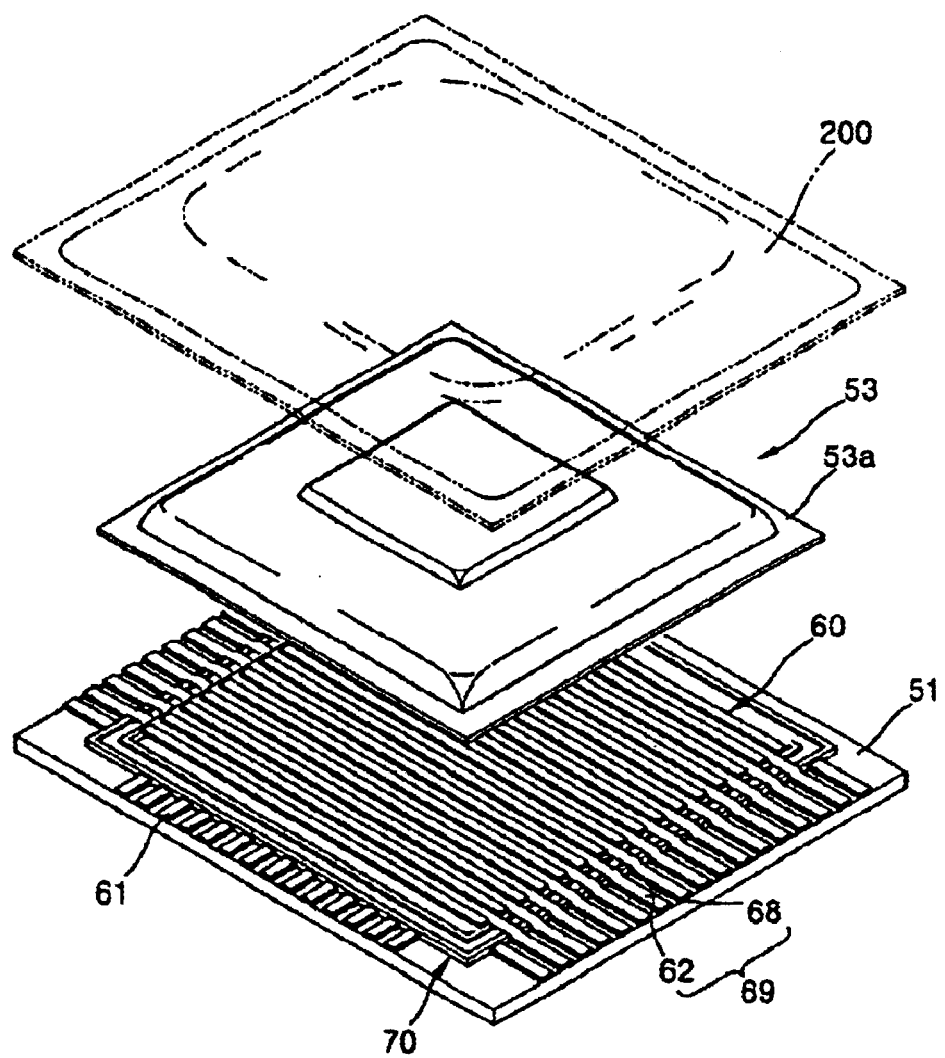
FIG. 6 is an exploded perspective view of an organic EL device according to an embodiment of the present invention.
Figure 7:
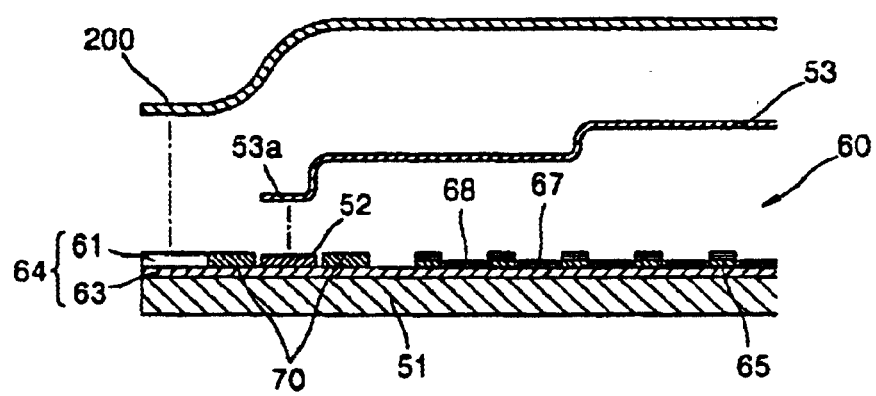
FIG. 7 is a partial sectional view of the organic EL device of FIG. 6.

Referring to FIGS. 6 and 7, which are a perspective view and a partial view, respectively, of an organic electroluminescent (EL) device according to an embodiment of the present invention, the organic EL device includes a transparent substrate 51, an organic emission portion 60 which is formed on the top surface of the substrate 51 and is operated with a current supplied through first and second electrode pad portions 61 and 62 located at the edges of the substrate 51, and a cap 53 having a bonding portion 53a to be attached to the substrate 51 using a sealant 52, which seals the organic emission portion 60 within its internal space when bonded to the substrate 51. The organic EL device also includes a barrier portion 70 capable of blocking the flow of the sealant on the substrate 51 in at least one direction, i.e., inwards and/or outwards of the bonding portion 53a of the cap 53 to which the sealant has been applied, and a flexible printed circuit (FPC) board 200 which connects the first and second electrode pad portions 61 and 62 to a circuit portion (not shown) to drive the organic emission portion 60.

The sealant 52 used in bonding the substrate 51 and the cap 53 may be, but is not limited to, a thermally curable sealant, a UV curable sealant, or a composite sealant of these materials.

The organic emission portion 60 includes a first electrode layer 64 having a series of first electrode lines 63 formed on the top surface of the substrate 51 as strips at predetermined intervals and connected to the first electrode pad portions 61, an internal insulator layer 65 formed on the substrate 51 as a predetermined pattern to divide the first electrode lines 63, and an organic layer 67 deposited on an exposed portion of the first electrode lines 63 as a predetermined pattern. The organic emission portion 60 also includes a series of second electrode lines 68 formed on the organic layer 67 to be insulated from the first electrode lines 63 and electrically connected to the second electrode pad portions 64.62. The second electrode pad portions 62 and the second electrode lines 68 constitute a second electrode layer 69.

Figure 8:
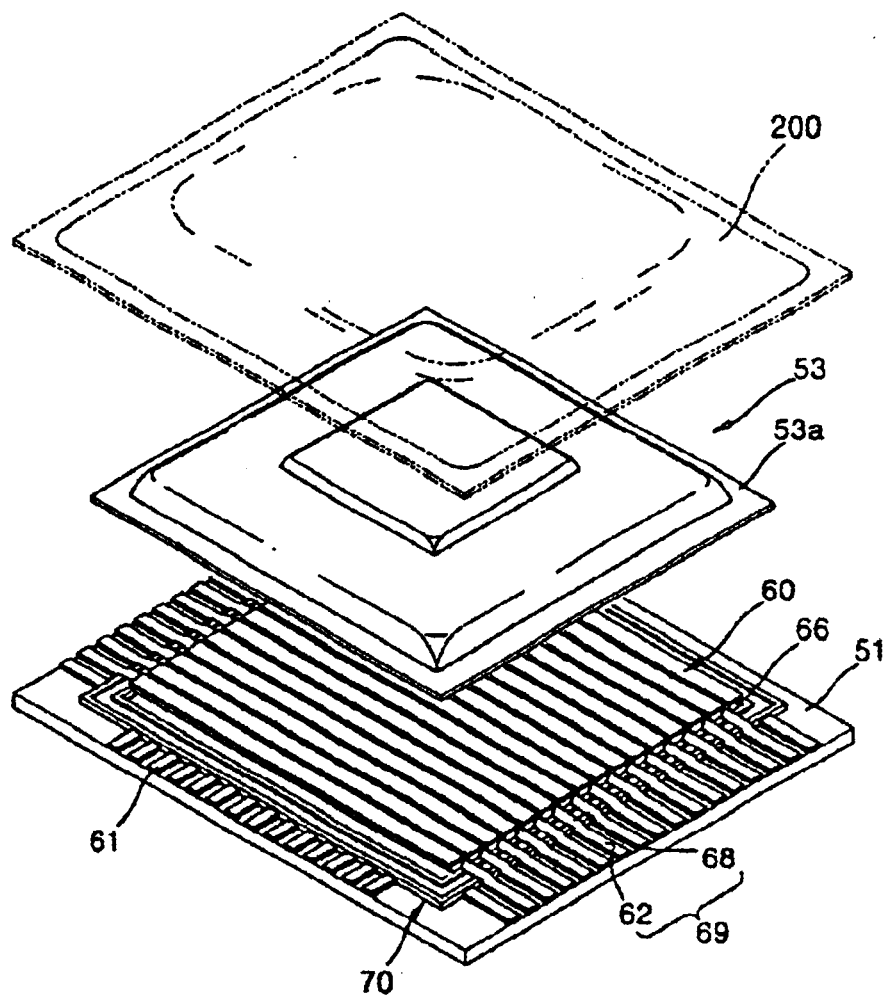
FIG. 8 is an exploded perspective view of another embodiment of an organic EL device according to the present invention.
Figure 9:
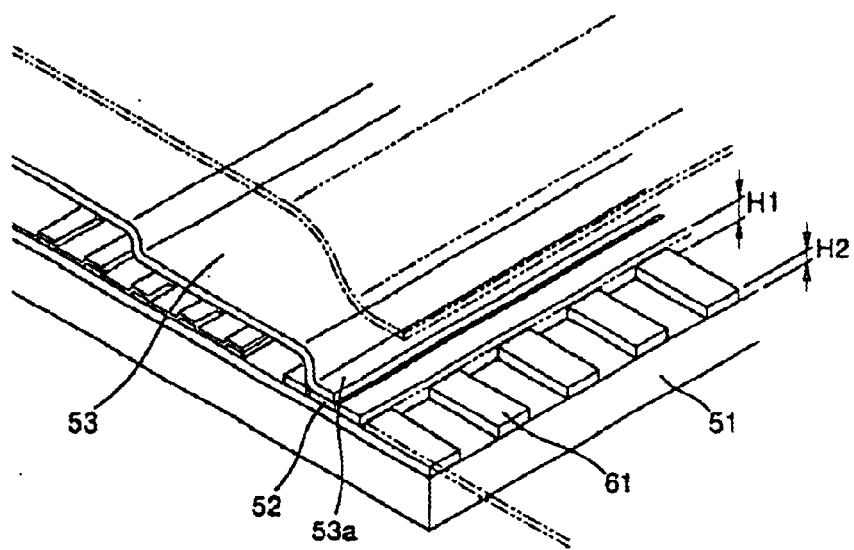
FIG. 9 is a partially enlarged perspective view of the organic EL device of FIG. 6.

The organic emission portion 60 is not limited to the structure described above and may be formed as a variety of patterns. For example, as illustrated in FIG. 8, a separator layer 66 with tapered sidewalls may be additionally formed on the internal insulator layer 65 to define separate regions of the second electrode lines 68 to be formed thereon, intersecting the first electrode lines 63.

As illustrated in FIGS. 6 through 9, the barrier portion 70 is formed inwards and/or outwards of a bonding site of the substrate 51, which is to be bonded to the bonding portion 83a of the cap 53, i.e., inside and/or outside of the space formed by the cap 53, such that the barrier portion 70 completely surrounds, adjacent to, a sealant apply region of the substrate 51 to be bonded with the bonding portion 53a. The barrier portion 70 maybe formed at the same time and using the same material as the first insulator layer 65 or the separator layer 66. In an embodiment of the present invention, a height H1 of the barrier portion 70 is greater than a height H2 of the first and second electrode pad portions 61 and 62 located at the edges of the substrate 51.

Figure 10:
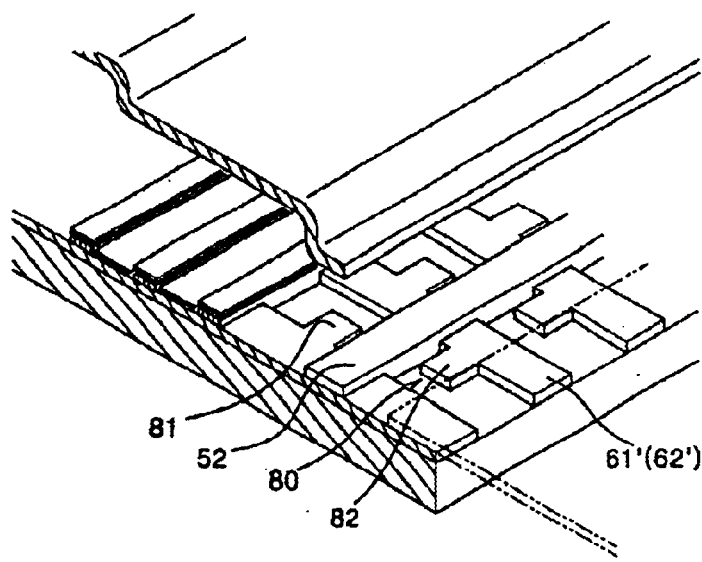
FIG. 10 is a perspective view of another example of a barrier portion according to the present invention.
Figure 11:
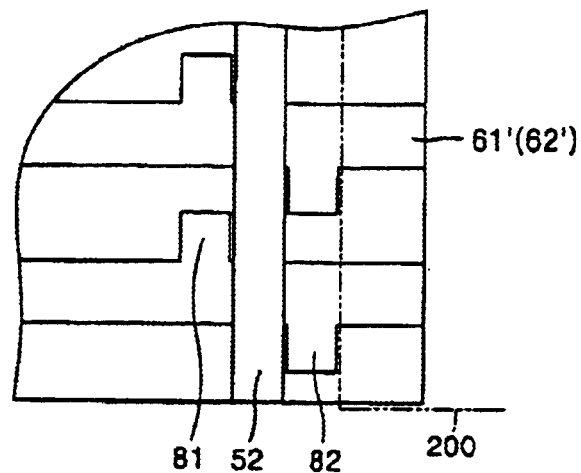
FIG. 11 is a plan view of the barrier portion and first (second) electrode pad portions illustrated in FIG. 10.

Another example of the barrier portion is illustrated in FIGS. 10 and 11. As illustrated in FIGS. 10 and 11, a barrier portion 80 includes at least one protrusion 81 or 82 protruding from each of the first (second) electrode pad portions 61'(62') in the same direction. It is preferable that the barrier portion 80 includes the protrusions 81 and 82 protruding from each part of the first (second) electrode pad portions 61'(62') divided by the sealant 52 (which can be referred to as a "sealant apply region"), which is to be brought into contact with the bonding portion 53a of the cap 53. More preferably, the protrusions 81 and 82 protrude from each part of the first (second) electrode pad portions 61'(62') divided by the sealant apply region 52 in a staggered fashion, as illustrated in FIGS. 10 and 11, i.e., in one direction on one side of the sealant apply region 52 and in the opposite direction on the other side of the sealant apply region 52.

Figure 12:
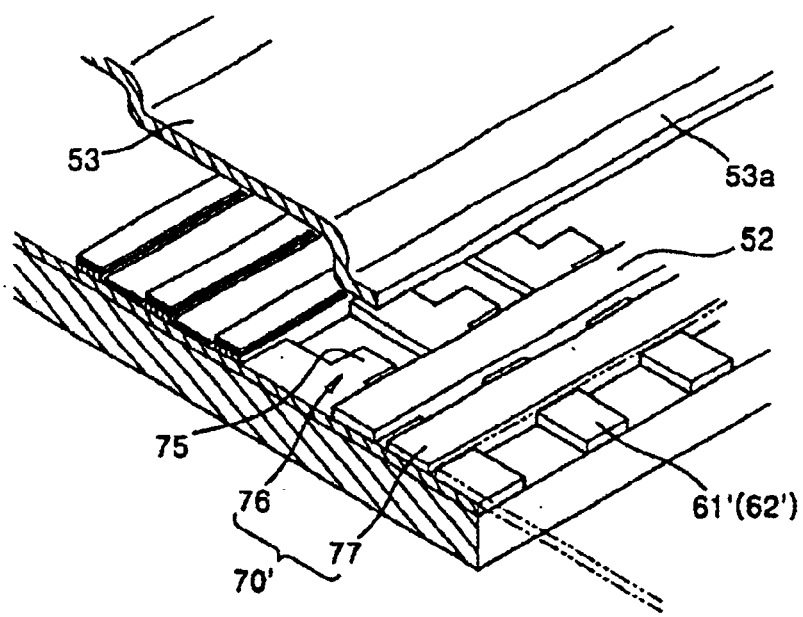
FIG. 12 is a partial perspective view of the first (second) electrode pad portions and another example of the barrier portion according to the present invention.
Figure 13:
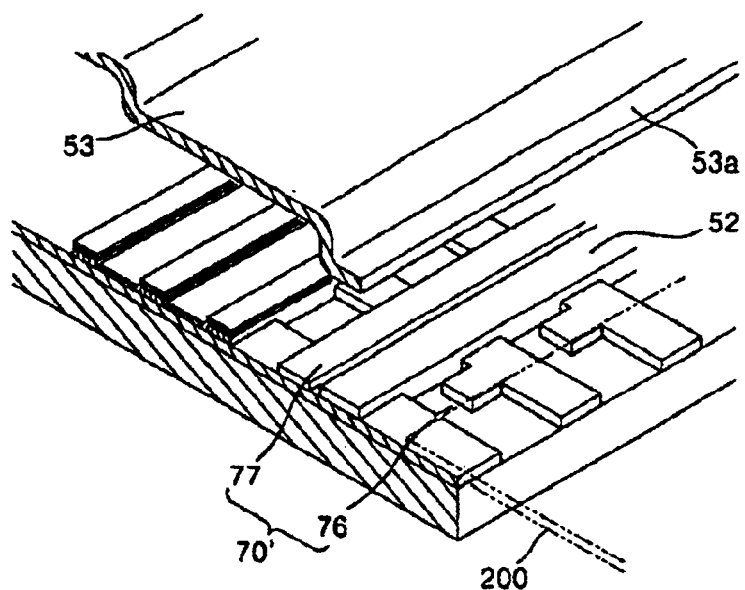
FIGS. 13 and 14 are partial perspective views of other examples of the barrier portion according to the present invention.

Alternatively, as illustrated in FIGS. 12 and 13, the barrier portion 70' may include a first barrier 76 formed as protrusions 75 protruding from one part of the first (second) electrode pad portions 61'(62') divided by the sealant apply region 52, which is to be coupled to the bonding portion 53a of the cap 53, and a second barrier 77 formed as a continuous bar at the other part.

Figure 14:
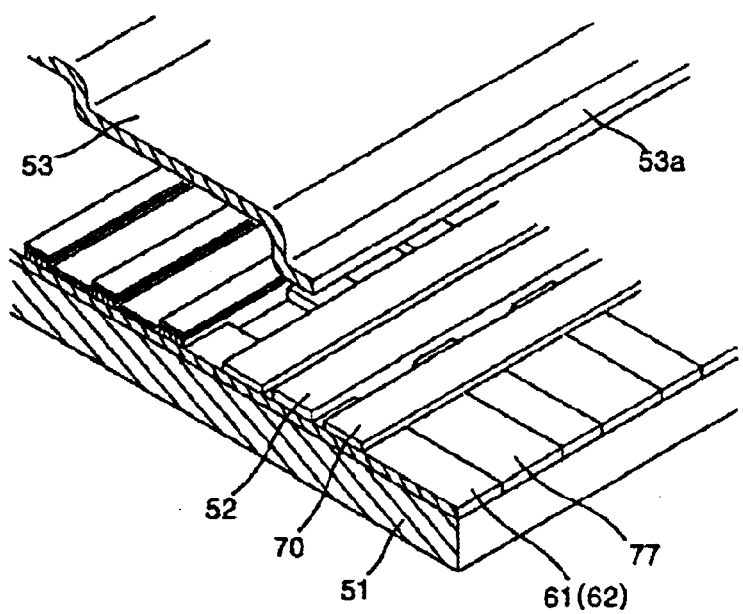
Figure 15:
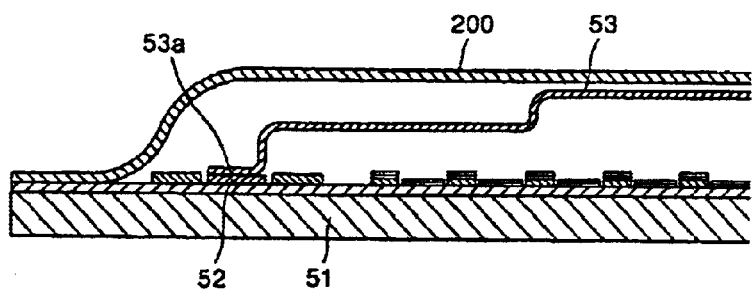
FIG. 15 is a sectional view of the organic EL device.
Figure 16:
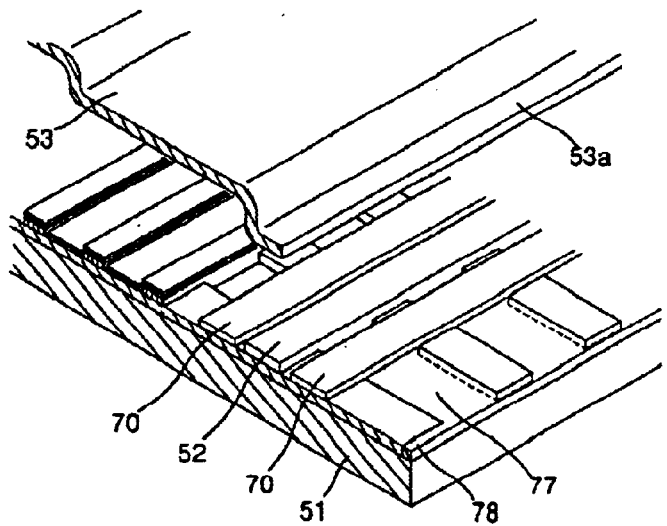
FIG. 16 is a partial perspective view of still another example of the barrier portion according to the present invention.

In the barrier portions 70, 70', and 80 having the configurations described above, an additional extension may be interposed between each of the first (second) electrode pad portions 61(62) formed at the edges of the substrate 51 to provide electrical connection with an FPC board 200. Referring to FIGS. 14 and 15, an extension 77 extending from the barrier portion 70, which is formed outwards of the sealant apply region 52 to be bonded to the cap 53, is formed between each of the first (second) electrode pad portions 61(62). This structure is used to prevent the first (second) electrode pad portions 61(62) from being partially exposed when connected to the FPC board 200. For the same purpose, an auxiliary barrier portion 78 may be formed along the edges of the substrate 51 to coat the ends of the first (second) electrode pad portions 61(62), as illustrated in FIG. 16.

In the organic EL devices according to the present invention having the structures described above, the barrier portions 70, 70', and 80 can block the sealant 52, applied on the substrate 51 and spread out when bonded to the bonding portion 53a of the cap 53, from entering the organic emission portion 60 and thus can protect the organic layer 67 of the organic emission portion 60 from being damaged by the solvent incorporated into the sealant 52.

In particular, when the extension 77 extending from the barrier portion 70 is interposed between each of the first or second electrode pad portions 61 or 62, and when the ends of the first and second electrode pad portions 61 and 62 are coated by the auxiliary barrier portion 78, any region of the first and second electrode pad portions 61 and 62 formed on the substrate 51 is not exposed when bonded to the FPC board 200. The result eliminates the problem of corrosion of the first and second electrode pad portions 61 and 62. In the organic EL devices according to the present invention, a channel is formed along the edge of the substrate by the barrier portion, which forces the sealant to diffuse along the channel even when excess sealant is applied and thereby reduces failures in spreading the sealant on the substrate 51.

Figure 17:
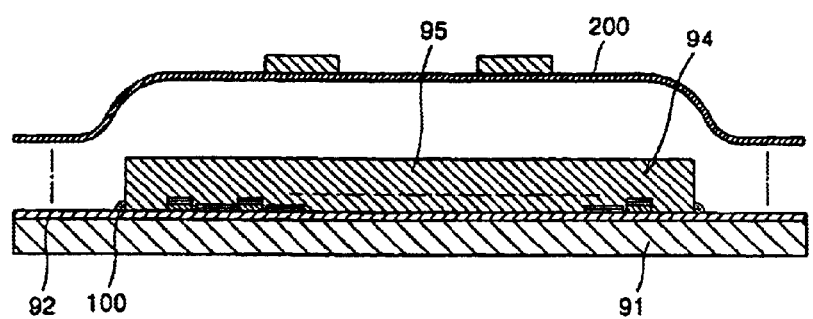
FIG. 17 is a sectional view of another embodiment of the organic EL device according to an embodiment of the present invention.
Figure 18:
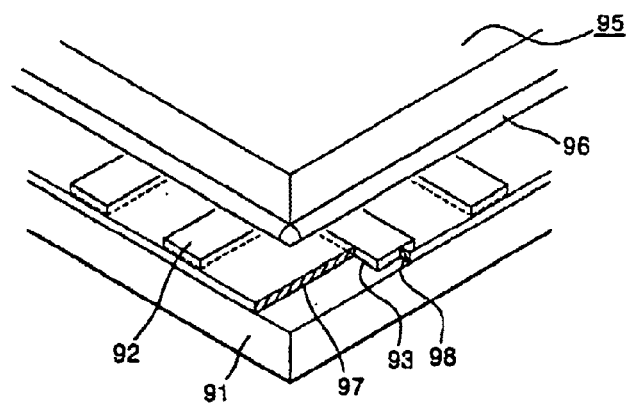
FIG. 18 is a partial perspective view of the organic EL device of FIG. 17.

FIGS. 17 and 18 illustrate another embodiment of the organic EL device according to the present invention. Referring to FIGS. 17 and 18, the organic EL device includes a transparent substrate 91, an organic emission portion 94 formed on the top of the substrate 91 as a predetermined pattern with first and second pad portions 92 and 93 extending to the edges of the substrate 91, a sealing layer 95 which seals the organic emission portion 94 except for the first and second electrode pad portions 92 and 93 located at the edges of the substrate 91, and an FPC board 200 to supply a predetermined current to the organic emission portion 94 in connection with the edge of the substrate 91. A barrier portion 96 is formed to cover the first and second electrode pad portions 92 and 93 of the substrate 91, which are exposed when bonded to the FPC board 200. The barrier portion 96 is formed on the substrate 91 along the boundary of the sealing layer 95 as a closed loop. An extension 97 extending from the barrier portion 96 is formed between each of the first (second) electrode pad portions 92(93), which are formed along the edges of the substrate 91 and are to be electrically connected to the FPC board 200. An auxiliary barrier portion 98 is formed along the edge of the substrate 91 to coat the ends of the extension 97 and the first (second) electrode pad portions 92(93).

Figure 19:
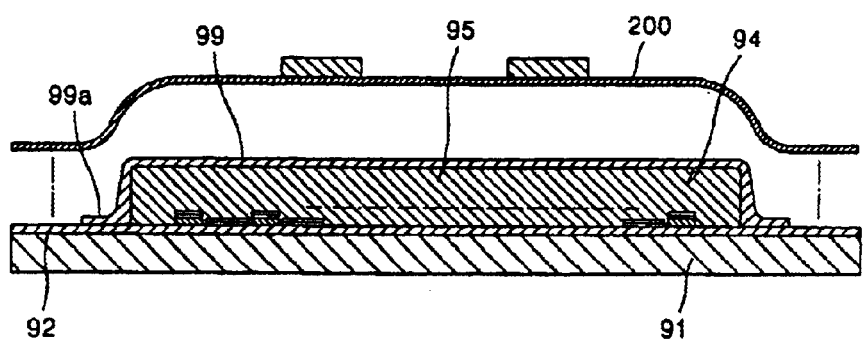
FIG. 19 is a sectional view of another embodiment of an organic EL device according to an embodiment of the present invention.

Alternatively, the organic emission portion 94 formed on the substrate 91 may be double sealed with an additional cap 99, as illustrated in FIG. 19. In this case, an additional barrier portion may be formed on the substrate 91 to prevent the sealant from spreading out over the substrate 91 when bonded to a cap bonding portion 99a. This additionally formed barrier portion is the same as that of the previous embodiments, and thus a description of the barrier portion will not be provided here.

In the organic EL device having the structure described above, the first and second electrode pad portions 92 and 93 formed on the substrate 91 are not exposed when connected to the FPC board 200, thereby protecting the first and second electrode pad portions 92 and 93 from being corroded. Double sealing of the organic emission portion 94 with the cap 99 enhances sealing reliability of the organic emission portion 94.

FIGS. 20 through 24B illustrate a method of manufacturing an organic EL device according to the present invention.

Figure 20:
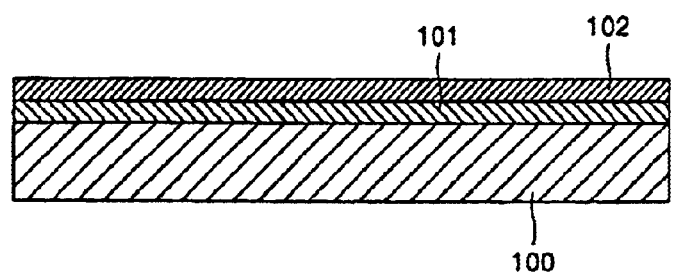
FIGS. 20 through 24 are sectional views illustrating a method of manufacturing an organic EL device according to an embodiment of the present invention.

To manufacture an organic EL device, a transparent substrate 100 with a transparent conductive layer 101 and a metal conductive layer 102 sequentially stacked thereon is initially prepared, as illustrated in FIG. 20.

Figure 21A:
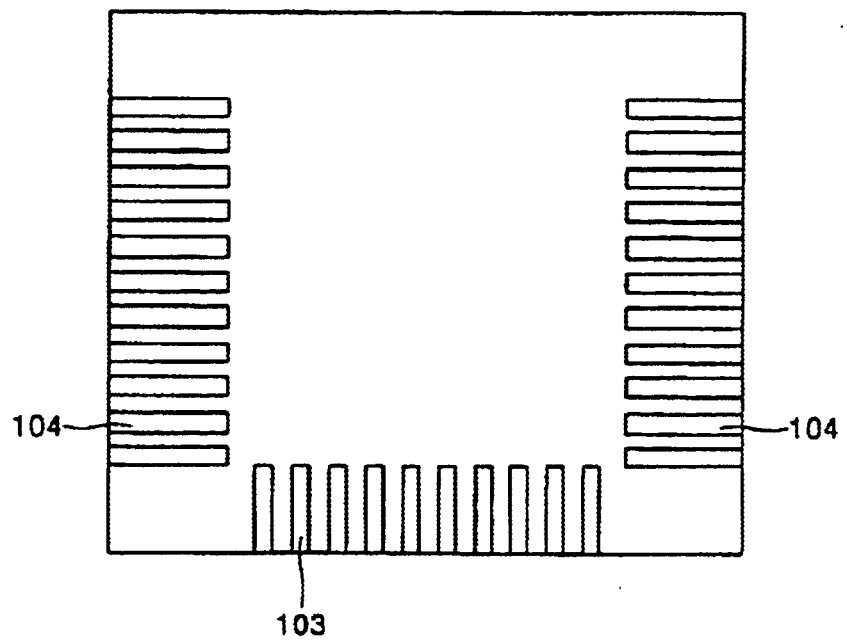
Figure 21B:
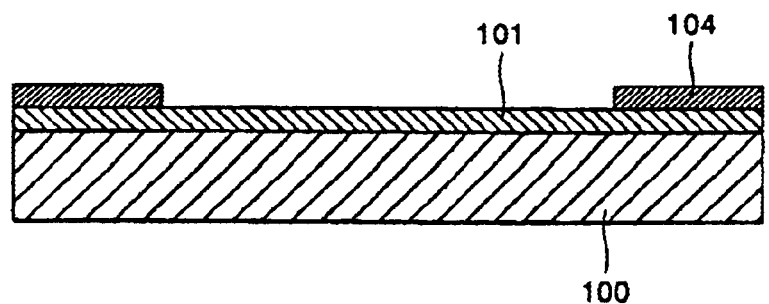
Figure 22A:
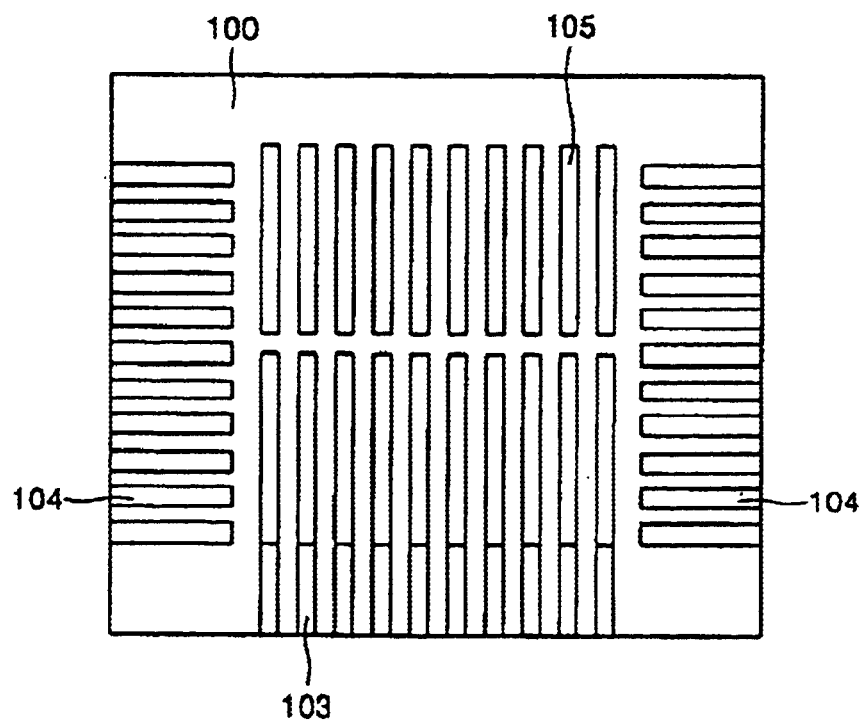
Figure 22B:
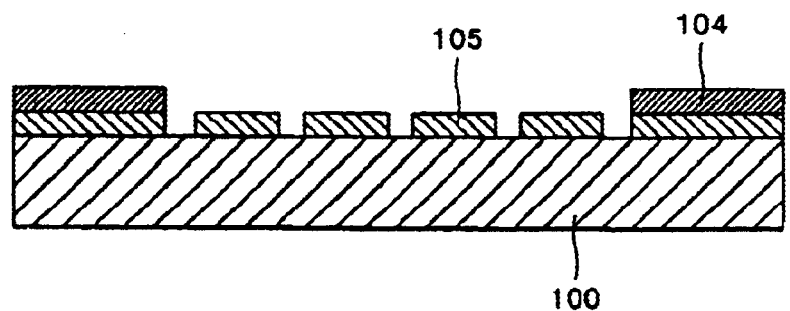

Next, referring to FIGS. 21A and 21B, the metal conductive layer 102 (FIG. 20) formed on the top surface of the transparent substrate 100 is processed to form first and second electrode pad portions 103 and 104 at the edges of the substrate 100. A portion of the transparent conductive layer 101 on the substrate 100, which is exposed by the first and second electrode pad portions 103 and 104, is processed into first electrode lines 105 as a predetermined pattern to be connected to the respective first electrode pad portions 103, as illustrated in FIGS. 22A and 22B. Formation of the first electrode lines 105 using the first and second electrode pad portions 103 and 104 and the transparent conductive layer 101 can be accomplished using, but not limited to, a photolithography method. As an example, it will be appreciated that the first and second electrode pad portions 103 and 104 and the first electrode lines 105 can be formed directly on the substrate 100 using a deposition method.

Figure 23A:
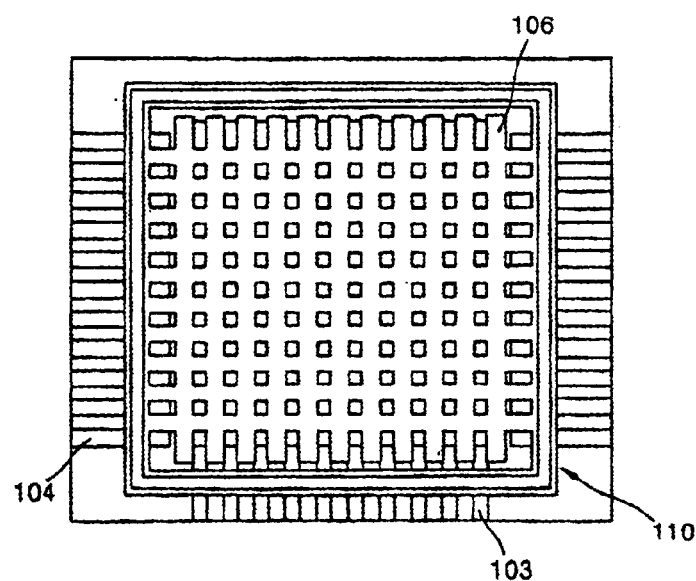
Figure 23B:
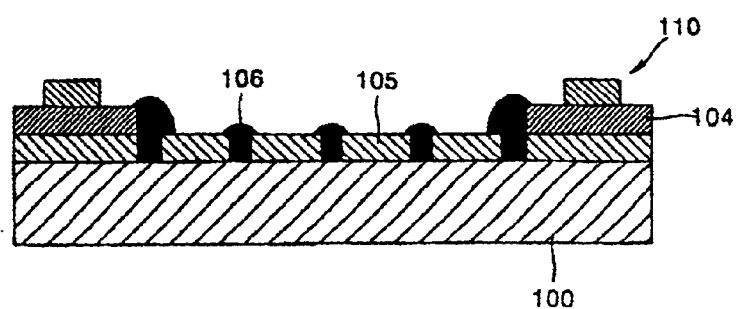
Figure 24:
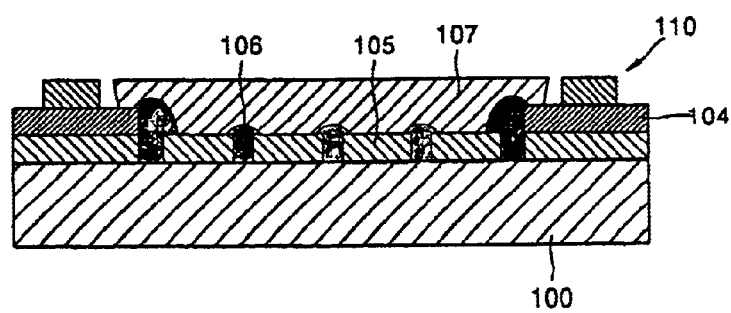
Figure 1:
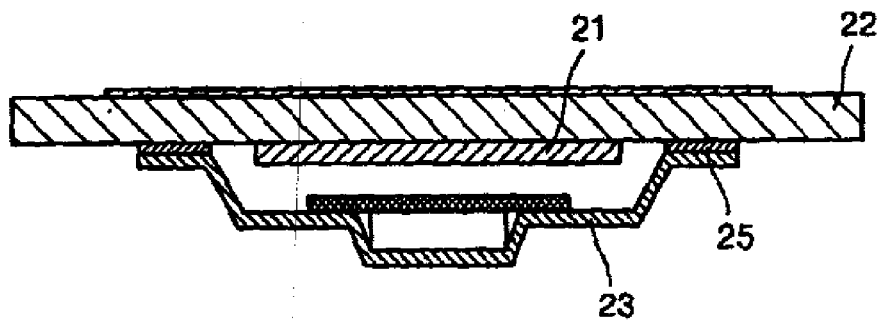
Figure 2:
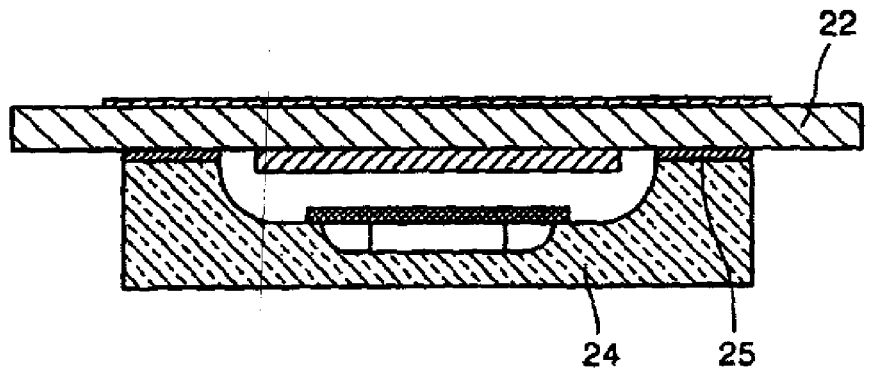
Figure 3:
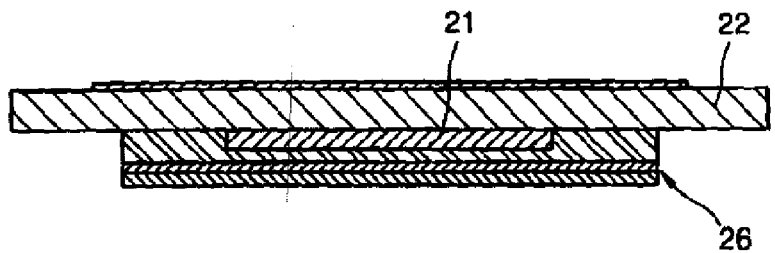
Figure 4:
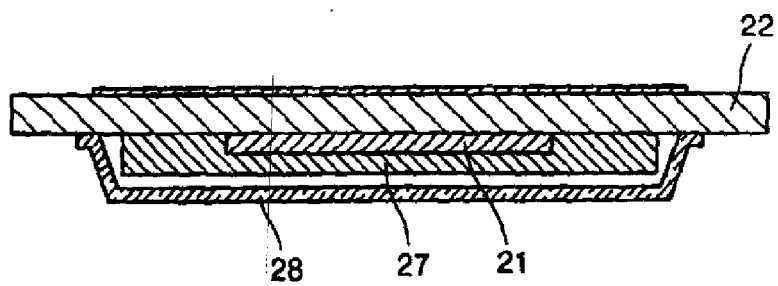
Figure 5:
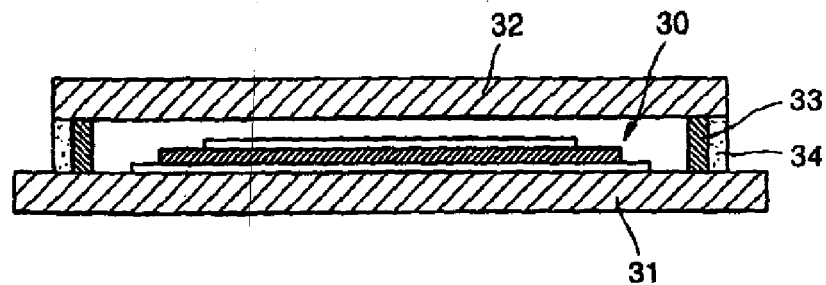
Figure 6:
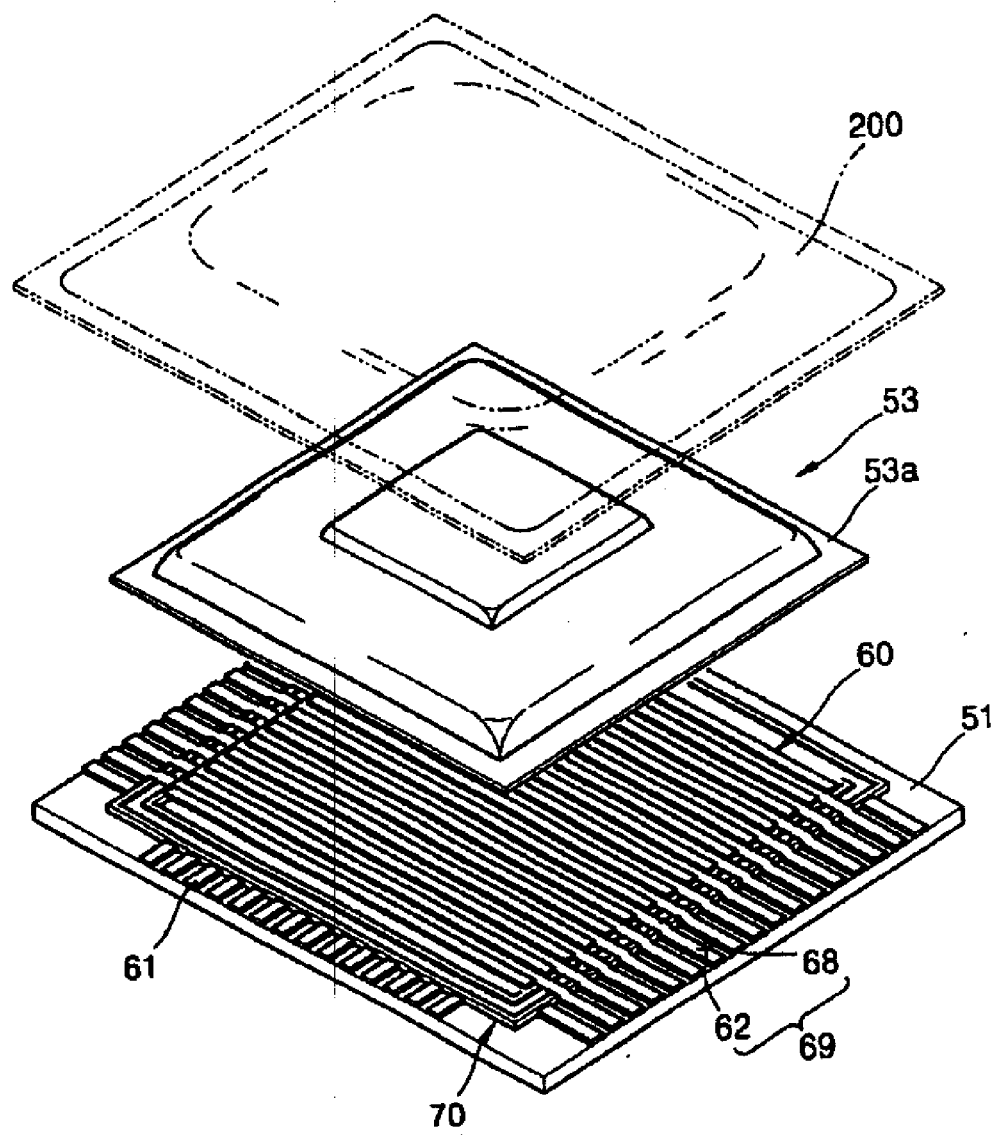
Figure 7:
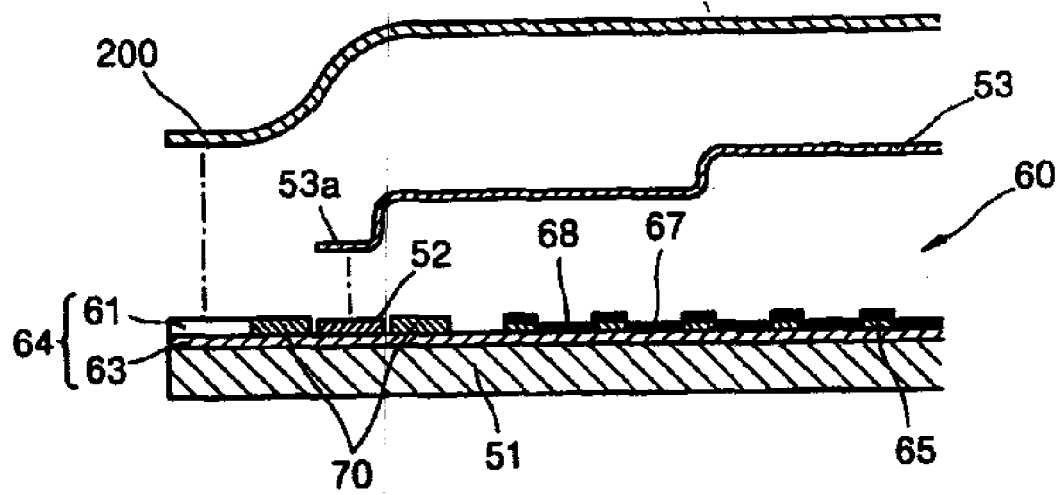
Figure 8:
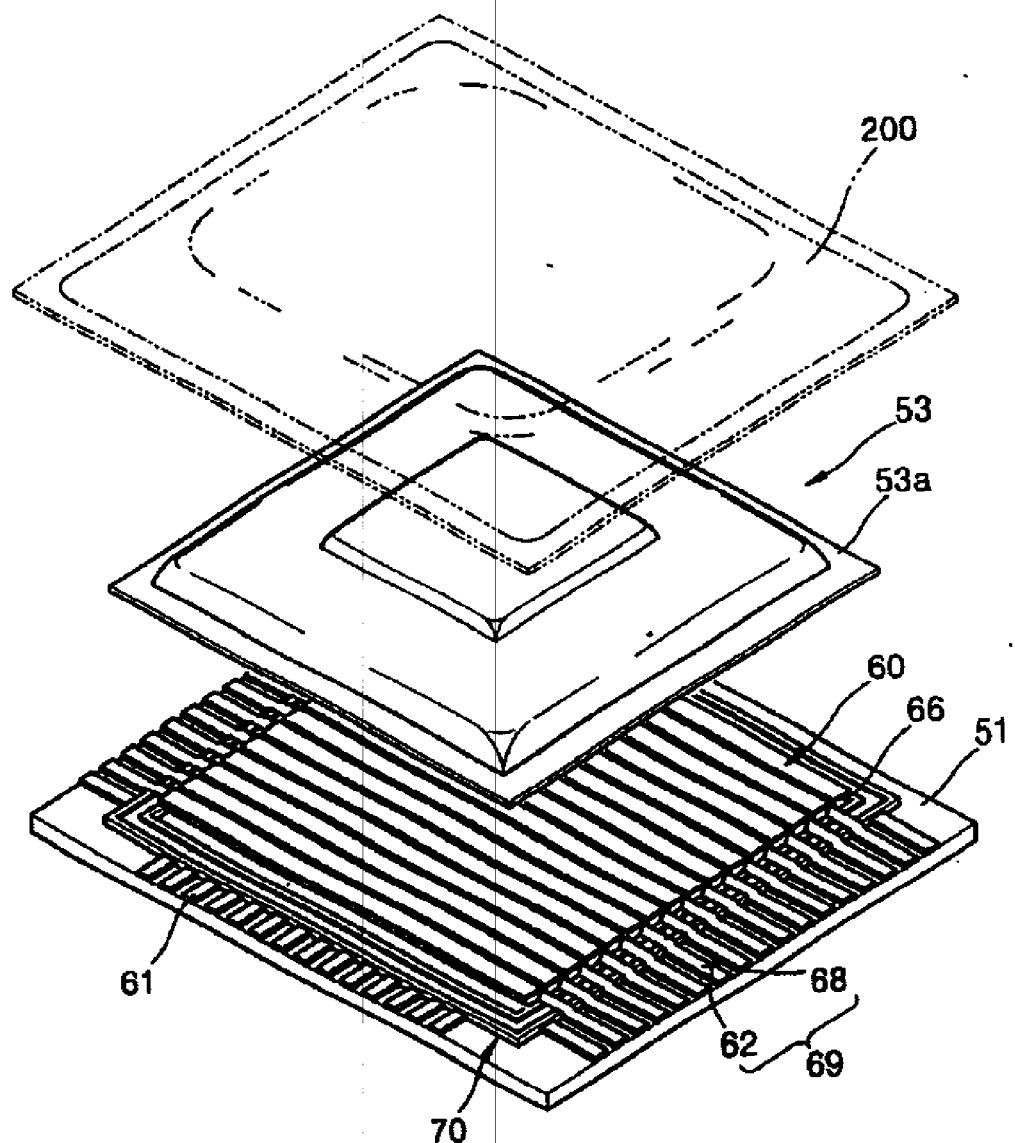
Figure 9:
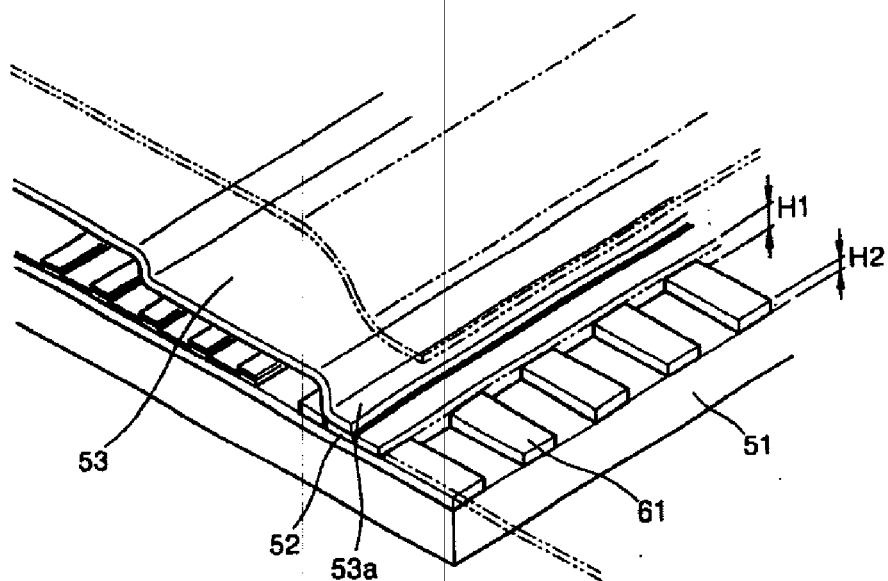
Figure 10:
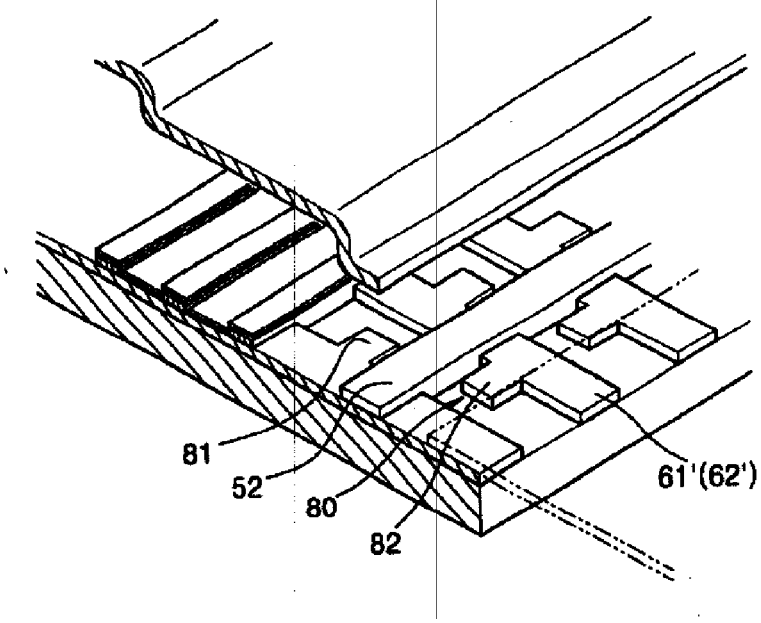
Figure 11:
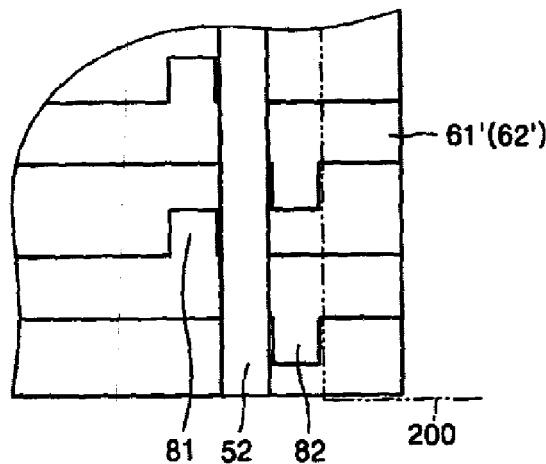
Figure 12:
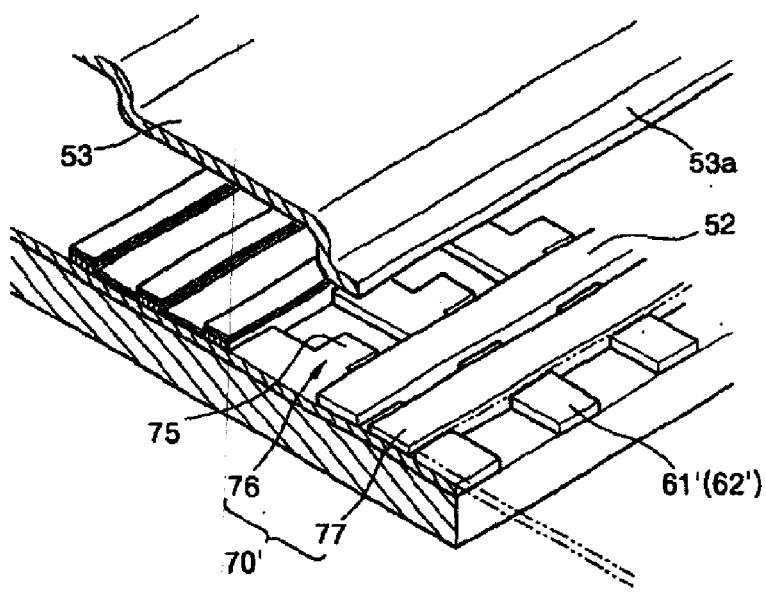
Figure 13:
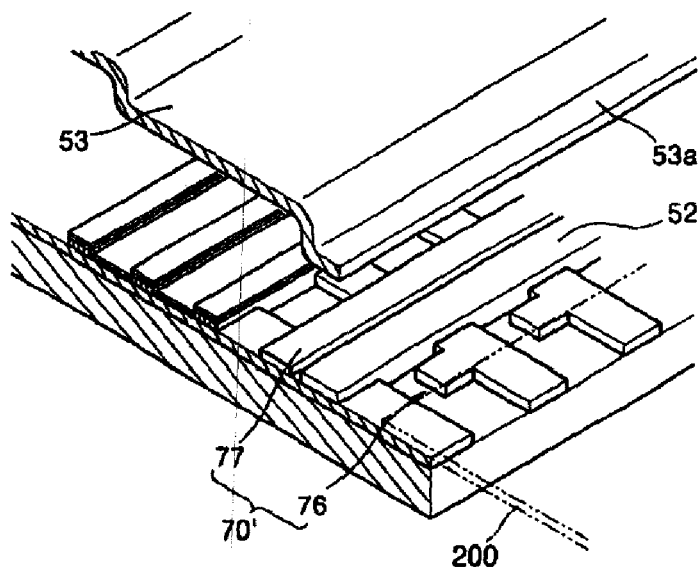
Figure 14:
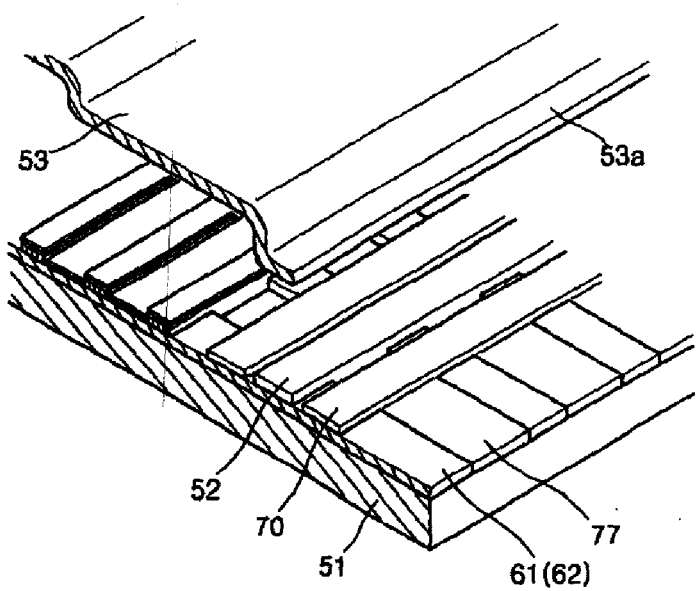
Figure 15:
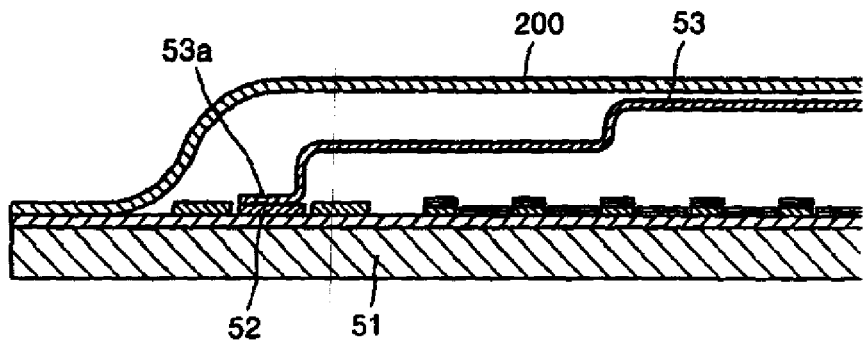
Figure 16:
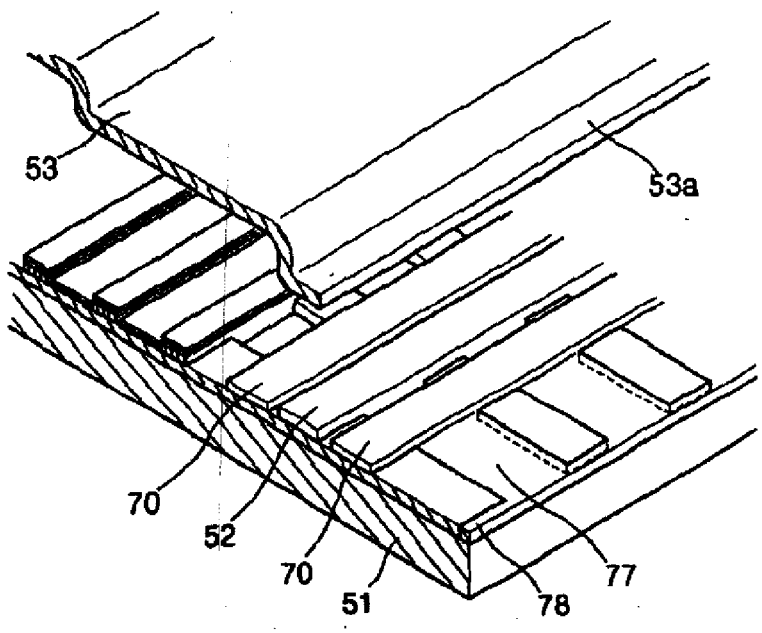
Figure 17:
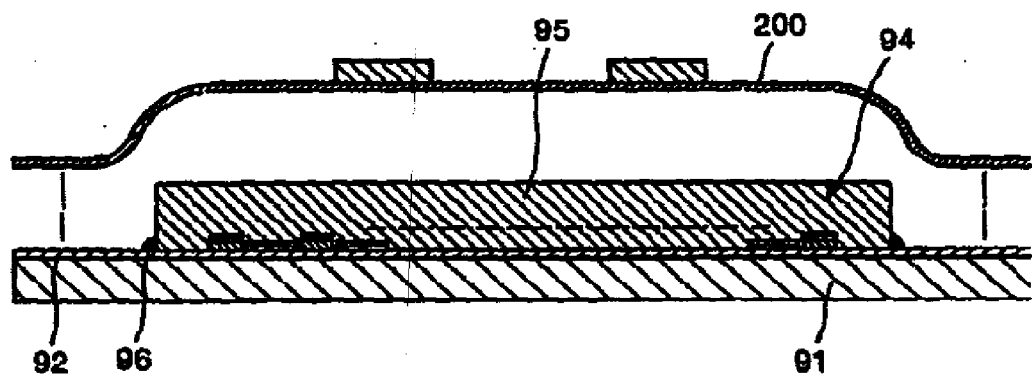
Figure 18:
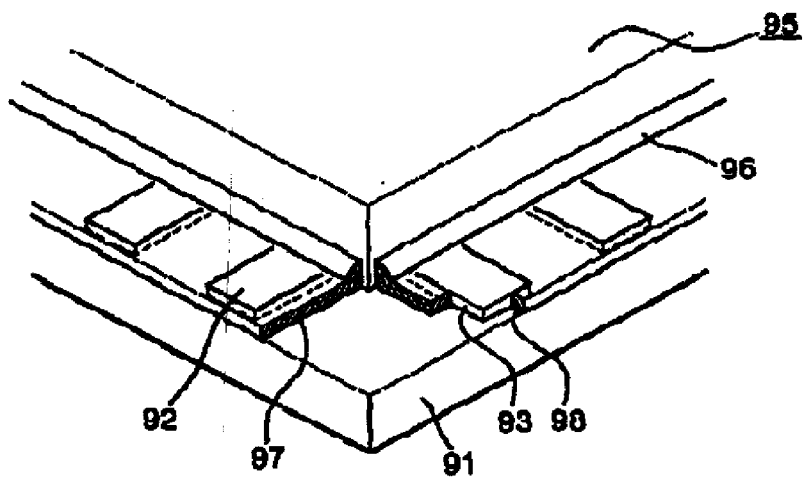
Figure 19:
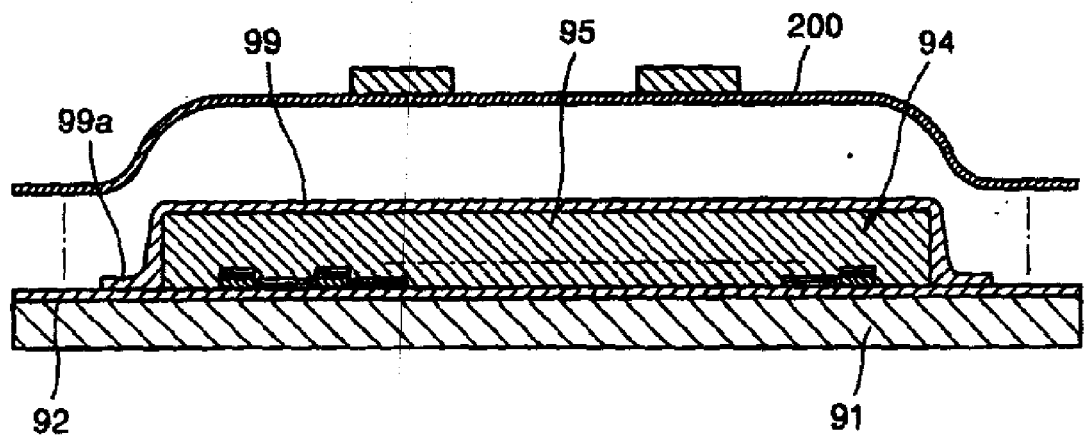
Figure 20:
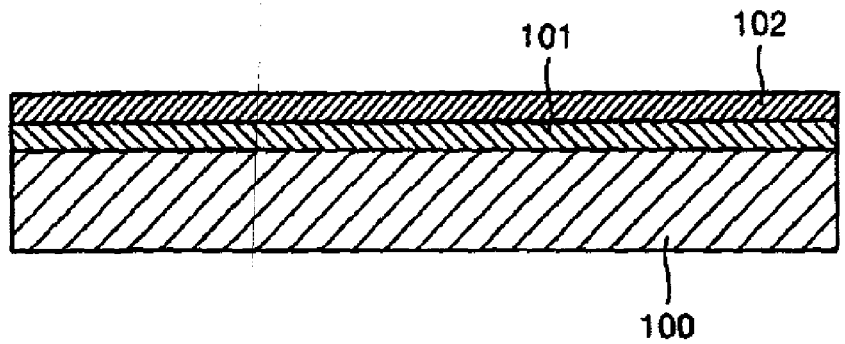
Figure 21A:
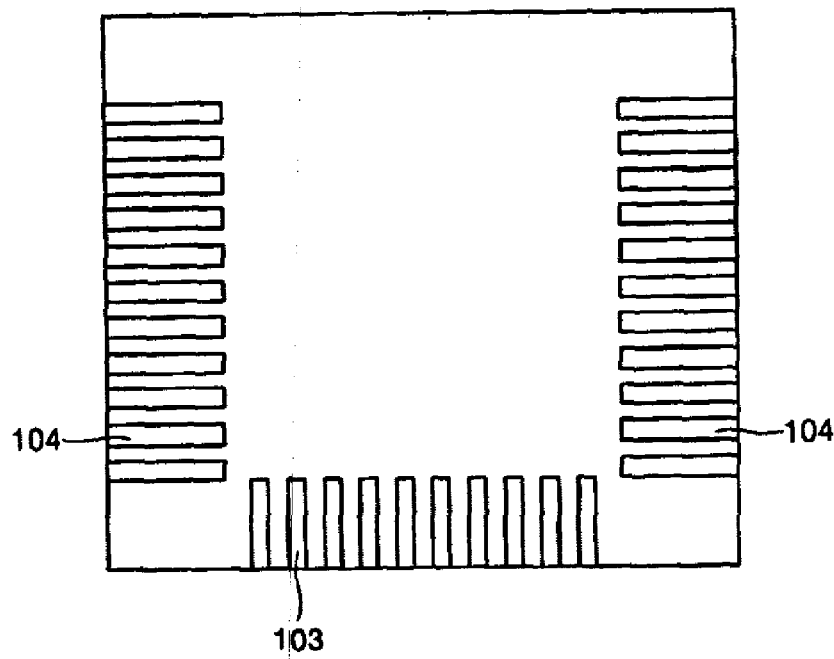
Figure 21B:
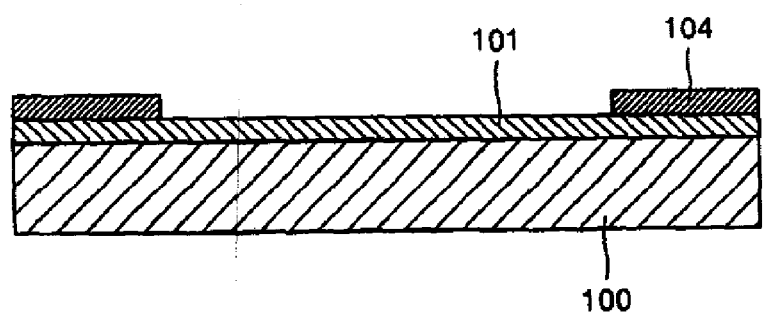
Figure 22A:
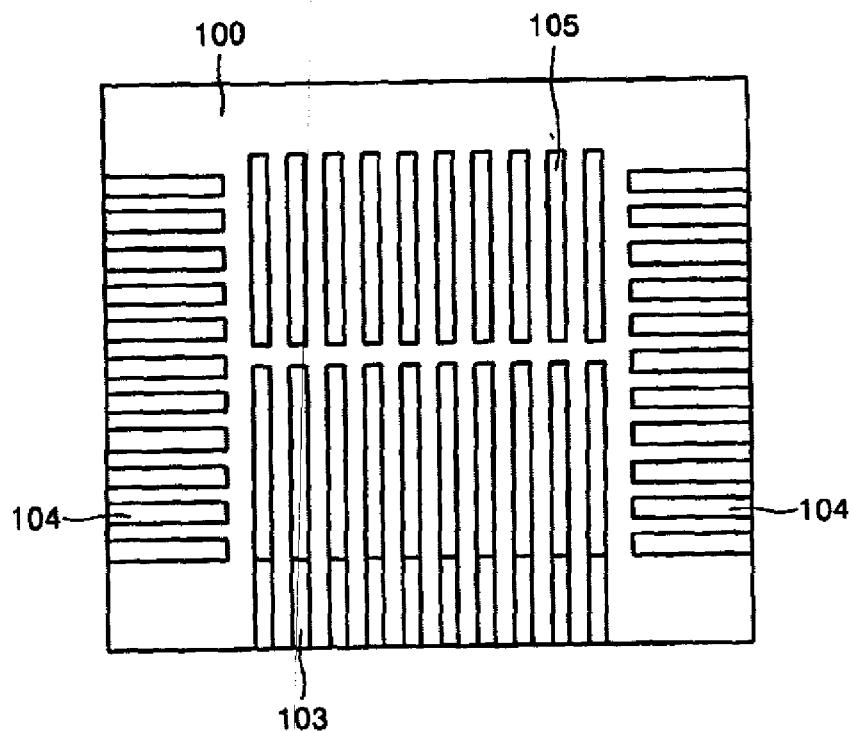
Figure 22B:
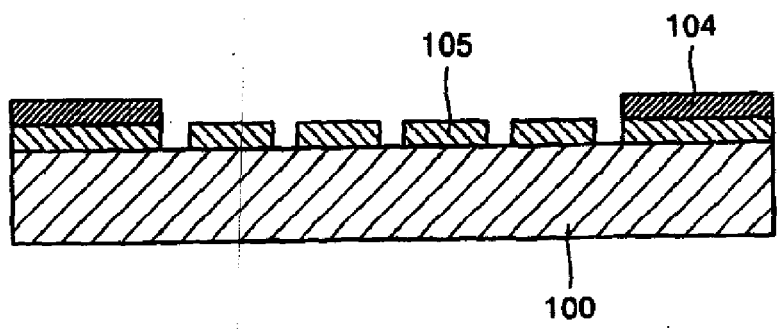
Figure 23A:
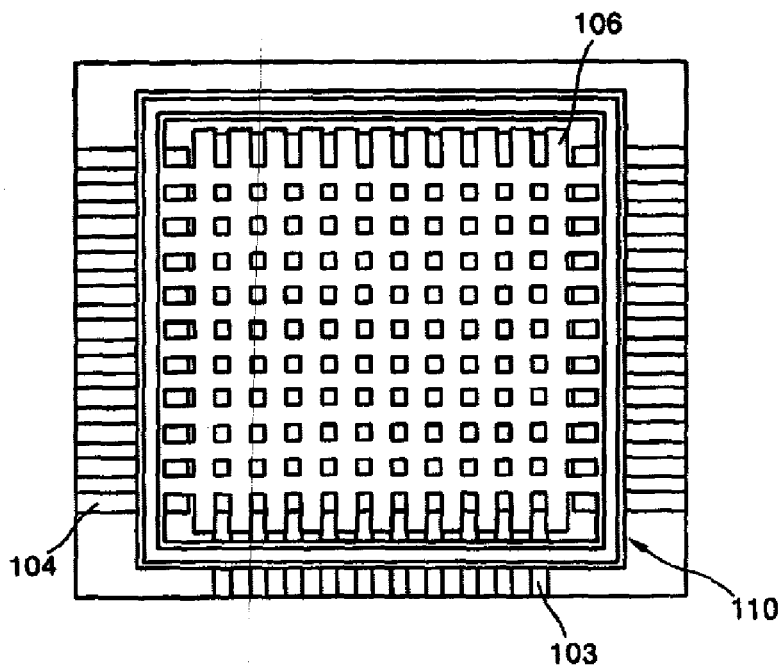
Figure 23B:
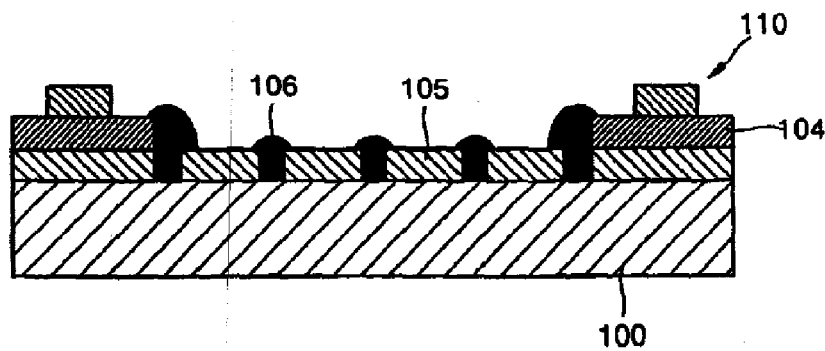
Figure 24A:
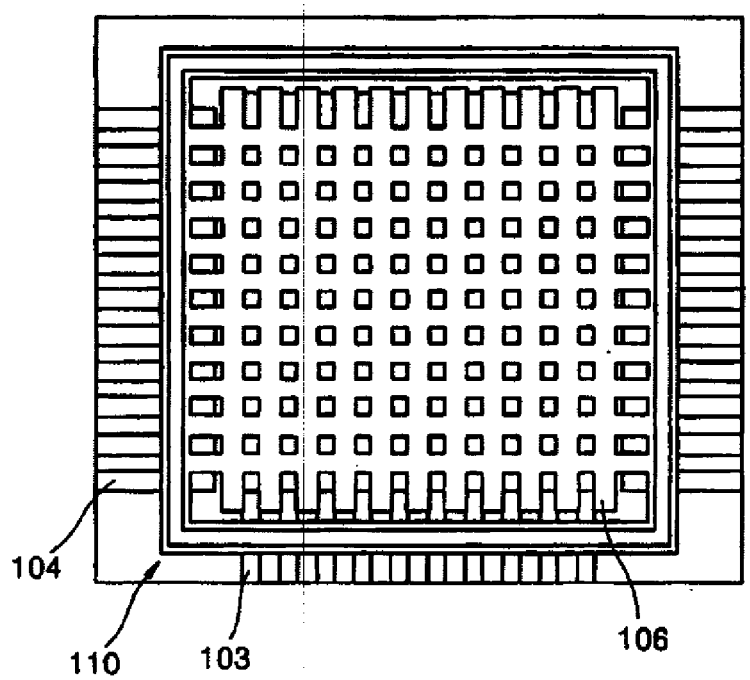
Figure 24B:
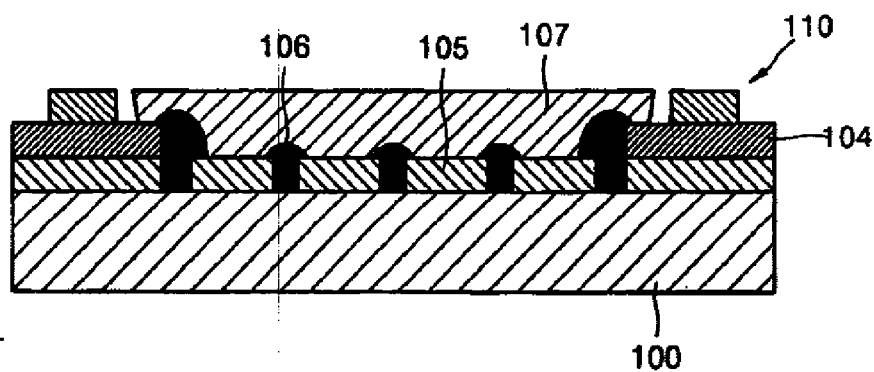

In this state, an internal insulator layer 106 is formed as a striped or grid pattern on the substrate 100, where the first and second electrode pad portions 103 and 104 and the first electrode lines 105 have been formed, to divide the first electrode lines 105 located at the active area, as illustrated in FIGS. 23A and 23B. A barrier portion 110, which blocks the sealant from spreading out toward the inside and the outside of the sealing space when the substrate 100 is sealed by a cap, is formed on the substrate 100 along the boundary of the active area. An extension (not shown) extending from the barrier portion 110 is formed between each of the first (second) electrode pad portions 103(104), and an auxiliary barrier portion (not shown) is formed to coat the ends of the extension and the first (second) electrode pad portions 103(104).

Once the formation of the barrier portion is completed, an organic layer and a conductive metal layer are deposited as a predetermined pattern using a mask to thereby form second electrode lines electrically connected to the respective second electrode pad portions 104.

To form individual second electrode lines acting as cathodes using a separator, instead of using a deposition mask having a striped pattern, a separator layer 107 (FIG. 24B) including a plurality of separators spaced a predetermined distance apart and extending in a direction perpendicular to the direction of the first electrode lines 105 may be formed on the surface of the substrate 100 having an internal insulator layer 106 not to cover the exposed portion of the first electrode lines 105. The barrier portion 110, the extension, and the auxiliary barrier portion may be formed of the same material as the internal insulator layer 106 or the separator layer 107. The barrier portion 110, the extension, and the auxiliary barrier portion may be formed at the same time as the internal insulator layer 106 or the separator layer 107.

After the formation of the organic layer and the second electrode lines, a cap is bonded to the substrate 100 to seal the device.

According to the organic EL device manufacturing method described above, the barrier portion, the extension portion, and the auxiliary barrier portion can be formed at the same time as the internal insulator layer 106 or the separator layer 107, without the need to perform separate processes, thereby improving productivity.

In the organic EL device having the structure described above and the method of manufacturing the organic EL device according to the present invention, quality degradation by the sealant spread out in a sealing process can be prevented with improved yield. After the substrate is bonded to an FPC board, the first and second electrode pad portions formed on the substrate are not exposed, so that the first and second electrode pad portions are protected from being corroded.

Although a few embodiments of the present invention have been shown and described, it will be appreciated by those skilled in the art that changes may be made in these embodiments without departing from the principles and spirit of the invention, the scope of which is defined in the claims and the equivalents.

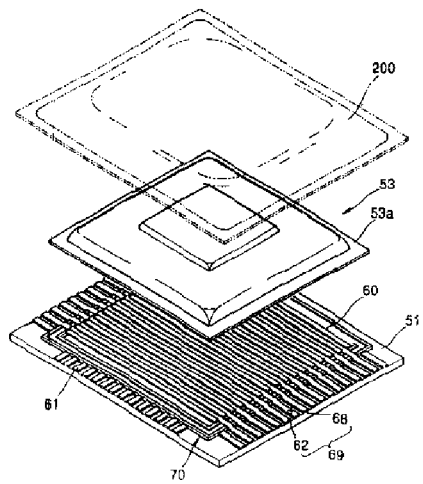

What is claimed is:

1. An organic electroluminescent device comprising:
   a substrate which is transparent;
   a first electrode layer including a series at first electrode lines formed on the top surface of said substrate as a predetermined pattern and connected to first electrode pad portions at two opposite edges of said substrate;
   an organic layer formed as a predetermined pattern on the first electrode lines;
   a second electrode layer including a series of second electrode lines formed on said organic layer as a predetertermined pattern to be insulated from said first electrode lines and connected to second electrode pad portions at the other two edges of said substrate;
   a cap bonded to said substrate using a sealant to seal said organic layer within an inner sealing space; end
   a barrier portion which blocks the flow of said sealant on said substrate inwards or outwards of said sealing space,
   wherein said barrier portion comprises at least one protrusion from each of said first and second electrode pad portions.

2. The organic electroluminescent device according to claim 1, wherein said at least one protrusion protrudes from each of said first and second electrode pad portions in a staggered fashion.

3. The organic electroluminescent device according to claim 2, wherein said at least one protrusion protrudes from each of said first and second electrode pad portions on both sides of a bonding site of said substrate on which said sealant is appllied.

4. An organic electroluminescent device comprising:
   a substrate which is transparent;
   a first electrode layer including a series of first electrode lines formed on the top surface of said substrate as a predetermined pattern and connected to first electrode pad portions at two opposite edges of said substrate;
   an organic layer formed as a predetermined pattern on the first electrode lines;
   a second electrode layer including a series of second electrode lines formed on said organic layer as a predetermined pattern to be insulated from said first electrode lines and connected to second electrode pad portions at the other two edges of said substrate;
   a cap bonded to said substrate using a sealant to seal said organic layer within an inner sealing space; and
   a barrier portion which blocks the flow of said sealant on said substrate inwards or outwards of said sealing space,
   wherein:
      said barrier portion further comprises an extension between each of said first and second electrode pad portions located at the edges of said substrate and to be electrically connected to a flexible printed circuit board, and
      said barrier portion further comprises an auxilary barrier portion along the edge of said substrate to coat the ends of said first and second electrode pad portions.

5. The organic electroluminescent device according to claim 4, wherein said barrier portion is formed outwards and adjacent to a bonding site of said substrate to have a height greater than said first and second electrode pad portions.

6. An organic electroluminescent device comprising:
   a substrate which is transparent;
   an organic emission portion including a first electrode layer having a series of first electrode lines formed on a top surface of said substrate as a predetermined pattern and connected to first electrode pad portions at two opposite edges of said substrate, an organic layer formed as a predetermined pattern on said first electrode lines, a second electrode layer having a series of second electrode lines formed on said organic layer as a predetermined pattern to be insulated from said first electrode lines and connected to second electrode pad portions at two other edges of said substrate;
   a sealing layer which covers only said organic emission portion entirely to seal said organic layer from an outer environment but uncovers said first and second electrode pad portions located at the edges of said substrate;
   a flexible printed circuit board which supplies a predetermined current to said series of first and second electrode lines in connection with said first and second electrode pad portions located at the edges of said substrate; and
   a barrier portion which covers a portion of said first and second electrode pad portions exposed when bonded to said flexible printed circuit board.

7. The organic electroluminescent device according to claim 6, wherein said barrier portion is formed on said substrate as a closed loop along the boundary of said sealing layer.

8. The organic electroluminescent device according to claim 6, wherein said barrier portion comprises an extension between each of said first and second electrode pad portions located at the edges of said substrate and electrically connected to said flexible printed circuit board.

9. An organic electroluminescent device comprising:
   a substrate which is transparent;
   an organic emission portion including a first electrode layer having a series of first electrode lines formed on a top surface of said substrate as a predetermined pattern and connected to first electrode pad portions at two opposite edges of said substrate, an organic layer formed as a predetermined pattern on said first electrode lines, a second electrode layer having a series of second electrode lines formed on said organic layer as a predetermined pattern to be insulated from said first electrode lines and connected to second electrode pad portions at two other edges of said substrate;

a sealing layer which covers only said organic emission portion but uncovers said first and second electrode pad portions located at the edges of said substrate;

a flexible printed circuit board which supplies a predetermined current to said series of first and second electrode lines in connection with said first and second electrode pad portions located at the edges of said substrate; and a barrier portion which covers a portion of said first and second electrode pad portions exposed when bonded to said flexible printed circuit board, wherein;

said barrier portion comprises an extension between each of said first and second electrode pad portions located at the edges of said substrate and electrically connected to said flexible printed circuit board, and said barrier portion further comprises an auxiliary barrier portion along the edges of said substrate to coat the ends of said first and second electrode pad portions.

10. The organic electroluminescent device according to claim 6, further comprising a cap boded to said substrate to cover said sealing layer.

11. The organic electroluminescent device according to claim 6, further comprising an internal insulation layer formed on said substrate as a predetermined pattern to divide said first electrode lines.

12. The organic electroluminescent device according to claim 11, further comprising a separator layer with tapered walls formed on said internal insulation layer to define separate regions of said second electrode lines, and intersects said first electrode lines.

13. The organic electroluminescent device according to claim 6, wherein said organic layer is deposited on an exposed portion of said first electrode lines.

* * * * *

UNITED STATES PATENT AND TRADEMARK OFFICE
CERTIFICATE OF CORRECTION

PATENT NO.    : 6,850,006 B2
DATED         : February 1, 2005
INVENTOR(S)   : Seon-Hee Kim et al.

It is certified that error appears in the above-identified patent and that said Letters Patent is hereby corrected as shown below:

Delete Title page illustrating figure, and substitute therefor new Title page illustrating figure. (attached)

Delete drawing sheets 1-20, 21A, 21B, 22A, 22B, 23A, 23B & 24, and substitute therefor drawing sheets 1-20, 21A, 21B, 22A, 22B, 23A, 23B, 24A & 24B, as shown on the attached sheets.

<u>Title page,</u>
Item [57], ABSTRACT,
Line 2, delete "are provided".

<u>Column 6,</u>
Line 16, delete "64".

Signed and Sealed this

Twelfth Day of July, 2005

JON W. DUDAS
*Director of the United States Patent and Trademark Office*

(12) United States Patent
Kim et al.

(10) Patent No.: US 6,850,006 B2
(45) Date of Patent: Feb. 1, 2005

(54) ORGANIC ELECTROLUMINESCENT DEVICE AND METHOD OF MANUFACTURING THE SAME

(75) Inventors: Seon Hee Kim, Busan Metropolitan (KR); Kyung Han Kim, Kyungju (KR); Tae Seung Kim, Busan Metropolitan (KR)

(73) Assignee: Samsung NEC Mobile Display Co., LTD, Ulsan Metropolitan (KR)

( * ) Notice: Subject to any disclaimer, the term of this patent is extended or adjusted under 35 U.S.C. 154(b) by 65 days.

(21) Appl. No.: 10/152,339

(22) Filed: May 22, 2002

(65) Prior Publication Data

US 2003/0080678 A1 May 1, 2003

(30) Foreign Application Priority Data

Oct. 26, 2001 (KR) .............................. 2001-66441

(51) Int. Cl.⁷ .............................................. H01J 1/70
(52) U.S. Cl. ................... 313/512; 313/506; 313/498; 313/504
(58) Field of Search ......................... 313/512, 498, 313/504, 506

(56) References Cited

U.S. PATENT DOCUMENTS

| | | | | |
|---|---|---|---|---|
| 4,829,213 A | * | 5/1989 | Pecile et al. | 313/509 |
| 5,814,935 A | | 9/1998 | Ujihara | |
| 5,883,465 A | * | 3/1999 | Inoguchi et al. | 313/509 |
| 6,140,765 A | * | 10/2000 | Kim et al. | 313/506 |
| 2002/0086180 A1 | * | 7/2002 | Seo et al. | 313/506 |

FOREIGN PATENT DOCUMENTS

| | | |
|---|---|---|
| EP | 0 609 074 | 8/1994 |
| EP | 0996314 | 4/2000 |
| EP | 1 109 224 | 6/2001 |
| EP | 1 253 653 | 10/2002 |
| JP | 9-274990 | 10/1997 |
| JP | 11-354272 | 12/1999 |
| JP | 2000-30858 | 1/2000 |
| JP | 2000-243555 | 9/2000 |
| JP | 2001291580 | 10/2001 |
| JP | 200.1189191 | 7/2002 |
| KR | 2000-0010172 | 2/2000 |
| WO | 00/69002 | 11/2000 |
| WO | 02/21557 | 3/2002 |

* cited by examiner

Primary Examiner—Nimeshkumar D. Patel
Assistant Examiner—Sharlene Leurig
(74) Attorney, Agent, or Firm—Staas & Halsey LLP

(57) ABSTRACT

An organic electroluminescent device and a method of manufacturing the same are provided. The organic electroluminescent device includes: a transparent substrate; a first electrode layer including a series of first electrode lines formed on the top surface of the substrate as a predetermined pattern and connected to first electrode pad portions at opposite edges of the substrate; an organic layer formed as a predetermined pattern on the first electrode lines; a second electrode layer including a series of second electrode lines formed on the substrate, on which the first electrode lines and the organic layer are formed, as a predetermined pattern to be insulated from the first electrode lines and connected to second electrode pad portions at the other edges of the substrate; a cap bonded to the substrate using a sealant to seal the organic layer within its inner sealing space; and a barrier portion which blocks the flow of the sealant on the substrate inwards or outwards the sealing space.

13 Claims, 15 Drawing Sheets